United States Patent
Iguchi

(10) Patent No.: US 10,873,740 B2
(45) Date of Patent: Dec. 22, 2020

(54) THREE-DIMENSIONAL IMAGE SENSOR, OPTICAL RADAR APPARATUS, AND PROCESSING APPARATUS

(71) Applicant: SHARP KABUSHIKI KAISHA, Sakai (JP)

(72) Inventor: Katsuji Iguchi, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 0 days.

(21) Appl. No.: 16/607,349

(22) PCT Filed: Apr. 6, 2018

(86) PCT No.: PCT/JP2018/014813
§ 371 (c)(1),
(2) Date: Oct. 22, 2019

(87) PCT Pub. No.: WO2018/198729
PCT Pub. Date: Nov. 1, 2018

(65) Prior Publication Data
US 2020/0137373 A1    Apr. 30, 2020

(30) Foreign Application Priority Data
Apr. 28, 2017 (JP) ................. 2017-090480

(51) Int. Cl.
*H04N 7/18* (2006.01)
*H04N 13/254* (2018.01)
(Continued)

(52) U.S. Cl.
CPC ......... *H04N 13/254* (2018.05); *G01S 7/4863* (2013.01); *G01S 17/894* (2020.01);
(Continued)

(58) Field of Classification Search
CPC ... H04N 13/254; G01S 17/894; G01S 7/4863; G01S 7/481; G01S 17/89;
(Continued)

(56) References Cited

U.S. PATENT DOCUMENTS 5,696,577 A  12/1997 Stettner et al.
5,892,575 A   4/1999 Marino
(Continued)

FOREIGN PATENT DOCUMENTS

AL   2016/208214 A1   12/2016

OTHER PUBLICATIONS

Zhou et al, 3D image generation with laser radar based on APD arrays (Year: 2015).*
(Continued)

*Primary Examiner* — Shan E Elahi
(74) *Attorney, Agent, or Firm* — ScienBiziP, P.C.

(57) ABSTRACT

An object is to realize a low-cost three-dimensional image sensor capable of providing a wide measurement range. The three-dimensional image sensor includes a light receiving unit including a plurality of pixels each including an SPAD (single-photon avalanche photodiode) configured to detect, in Geiger mode, a photon of incident light including reflected light from an object to be detected, a plurality of pixel storage elements provided for the respective pixels in a one-to-one manner, each pixel storage unit being configured to count a accumulated value of pulse signals output from a corresponding one of the pixels as a result of detecting photons for each of temporally successive time intervals, and a signal processing circuit (DS) configured to calculate distance information regarding a distance between a light receiving unit and an object for each pixel by using groups of accumulated values accumulated by the pixel storage elements.

11 Claims, 10 Drawing Sheets

(51) Int. Cl.
 *G01S 17/894* (2020.01)
 *G01S 7/4863* (2020.01)
 *H01L 27/146* (2006.01)

(52) U.S. Cl.
 CPC .. *H01L 27/14623* (2013.01); *H01L 27/14627* (2013.01); *H01L 27/14643* (2013.01)

(58) Field of Classification Search
 CPC ......... H01L 27/14623; H01L 27/14627; H01L 27/14643; G01C 3/06
 See application file for complete search history.

(56) References Cited

U.S. PATENT DOCUMENTS

| | | | |
|---|---|---|---|
| 8,130,367 B2 | 3/2012 | Stettner et al. | |
| 2007/0182949 A1* | 8/2007 | Niclass | G01S 7/491 356/3 |
| 2018/0045513 A1* | 2/2018 | Kitamura | G01S 17/10 |

OTHER PUBLICATIONS

Niclass et al., "A 0.18-μm CMOS SoC for a 100-m-Range 10-Frame/s 200 x 96-Pixel Time-of-Flight Depth Sensor", IEEE Journal of Solid-State Circuits, vol. 49, No. 1, Jan. 2014, pp. 315-330.
Niclass et al., "Single-Photon Synchronous Detection", IEEE Journal of Solid-State Circuits, vol. 44, No. 7, Jul. 2009, pp. 1977-1989.

\* cited by examiner

152: OPTICAL BANDPASS FILTER
153: THREE-DIMENSIONAL IMAGE SENSOR
170: PACKAGE
171: LID GLASS
172: ATMOSPHERE

181: MICROLENS
182: METAL SHIELD
182a: OPENING
183: SILICON SUBSTRATE
184: P+ DIFFUSION LAYER
185: N-TYPE DIFFUSION LAYER

THREE-DIMENSIONAL IMAGE SENSOR, OPTICAL RADAR APPARATUS, AND PROCESSING APPARATUS

TECHNICAL FIELD

The present invention relates to a three-dimensional image sensor configured to acquire a three-dimensional image including a two-dimensional image of an object and distance information regarding a distance to the object.

BACKGROUND ART

A three-dimensional image is a concept that includes distance information regarding a distance to an object in a field of view in addition to a two-dimensional image such as a usual photograph. In recent years, a three-dimensional image sensor for detecting such a three-dimensional image has become extremely important as a sensor used for recognition of an environment around a vehicle, a robot, and the like. CCD and CMOS imagers are widely used as two-dimensional image sensors for detecting two-dimensional images. Both CCD and CMOS imagers convert light intensity into electric signals using silicon photodiodes thereby obtaining images. In a widely used method of measuring a distance with high accuracy, a target object is irradiated with laser light, and a time-of-flight from the laser light emission until reflected laser light returns back from the object is measured.

To irradiate the entire field of view with a laser light, two methods are known. One is a scan-based irradiation technique in which a laser light focused in a dot or band shape is scanned using a mirror or the like. The second one is a wide-area simultaneous irradiation technique in which laser light is spread almost uniformly over the entire field of view thereby irradiating a whole area at a time. The scan-based irradiation technique is capable of easily providing a strong beam intensity on an object, and thus many techniques have been developed. One of them is disclosed in NPL 1. The scan-based irradiation techniques require a mechanical mechanism for scanning the beam, which results in an increase in cost and an increase in an apparatus size. On the other hand, the wide-area simultaneous irradiation technique does not need a mechanical mechanism to scan, and thus it is easy to reduce the size. But the laser light intensity on an object is weak compared to the scan-based irradiation technique. Therefore, when the distance to the object is large, the signal strength is low, which results in a reduction in the distance measurement accuracy.

In the time-of-flight measurement, the time measurement accuracy is directly related to distance accuracy. In view of the above, in a known method, pulsed laser light is emitted a plurality of times, and the time from light emission till light reception is measured repeatedly. A histogram (in which time is taken in a horizontal axis, and frequency is taken in a vertical axis) is generated and a flight time is determined from the histogram. This method is called TCSPC (Time Correlated Single Photon Counting).

A SPAD (Single Photon Avalanche Diode) is used as a light receiving element. For example, as described in PTL 2 and NPL 1, in this light receiving element, each pixel is large in terms of circuit scale, and thus this type light receiving element is not used in an imager in which a large number of pixels are two-dimensionally arranged. Instead, this type light receiving element is mainly used in combination with the scan-based irradiation technique.

On the other hand, in the wide-area simultaneous irradiation technique, a current of a photodiode is measured and compared with a reference value to determine the flight time. In the wide-area simultaneous irradiation technique, the current may be temporally sequentially accumulated in an array of capacitors, and the flight time may be determined based on the accumulated amount. In this method, a three-dimensional image can be constructed with a single laser irradiation, and thus, as in the case of a photograph taken with a flash, synchronism was ensured over the entire field of view. Thus, for example, as disclosed in PTL 1 and PTL 3, the wide-area simultaneous irradiation technique is extremely different from the scan-based irradiation technique in which the time is different from one point to another in the visual field, and thus the wide-area simultaneous irradiation technique is expressed as "flash".

CITATION LIST

Patent Literature

PTL 1: U.S. Pat. No. 5,696,577 (Dec. 9, 1997)
PTL 2: U.S. Pat. No. 5,892,575 (Apr. 6, 1999)
PTL 3: U.S. Pat. No. 8,130,367 (Mar. 6, 2012)

Non Patent Literature

NPL 1: Cristiano Niclass, Member, IEEE, Mineki Soga, Hiroyuki Matsubara, Masaru Ogawa, and Manabu Kagami, Member, IEEE, IEEE JOURNAL OF SOLID-STATE CIRCUITS, VOL. 49, NO. 1, JANUARY 2014, P 315-330 "A 0.18-µm CMOSS SoC for a 100-m-Range 10-Frame/s 200×96-Pixel Time-of-Flight Depth Sensor."

SUMMARY OF INVENTION

Technical Problem

However, the conventional techniques described above have the following problems.

For use in consumer vehicles, robots, and the like, downsizing and durability of the apparatus are extremely important, and thus the scan-based irradiation technique is not preferable. On the other hand, in the wide-area simultaneous irradiation technique, background light may cause a problem, and measures against it may be necessary. In vehicle applications, the optical radar apparatus needs to operate even under intense sunlight at midday just on the equator. In a sensor disclosed in PTL 1, in order to minimize the influence of background light during the day, infrared light with a wavelength of about 1.5 µm is used. Therefore, a silicon type light receiving element cannot be used, and, instead, a compound semiconductor such as InGaAs is used. In this sensor, a silicon LSI is used to perform signal processing. For this reason, in this sensor, an InGaAs photodiode and a silicon LSI are disposed in a laminated form, which results in an increase in material cost and production cost. Thus, the apparatus becomes very expensive.

Therefore, there is a need for a three-dimensional image sensor configured such that all functions including a light reception function and a signal processing function are implemented on a single silicon chip, which is inexpensive and provides a wide measurement range. Besides, there is a need for an optical radar apparatus based on the wide-area simultaneous irradiation technique using the three-dimensional image sensor described above.

An object of an aspect of the present invention is to realize a low-cost three-dimensional image sensor capable of providing a wide measurement range.

Solution to Problem

According to an aspect of the present invention, to solve the above problem, a three-dimensional image sensor includes a light receiving unit including a plurality of pixels each including an avalanche photodiode configured to detect, in a Geiger mode, a photon of incident light including reflected light from an object to be detected, a plurality of accumulating units provided for the respective pixels in a one-to-one manner, each accumulating unit being configured to accumulate pulse signals output from a corresponding one of the pixels as a result of detecting photons for each of temporally successive time intervals, and a calculation unit configured to calculate distance information regarding a distance between the light receiving unit and the object for each pixel by using a time series of groups of accumulated values accumulated by the accumulating units.

Advantageous Effects of Invention

In an aspect of the present invention, it is possible to realize a low-cost three-dimensional image sensor capable of providing a wide measurement range.

DESCRIPTION OF EMBODIMENTS

Figure 1:
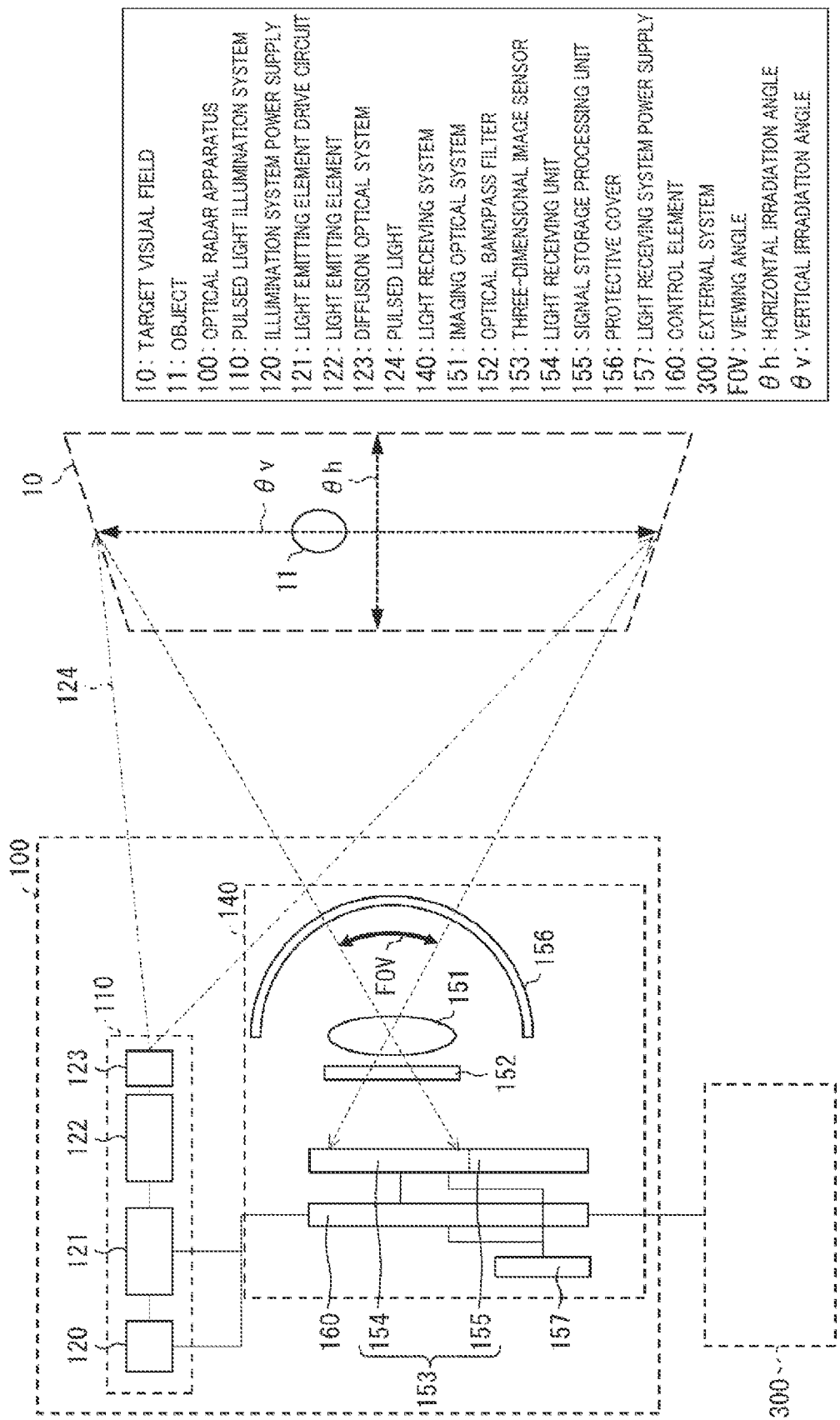
FIG. 1 is a diagram illustrating a configuration of an optical radar apparatus according to Embodiment 1 of the present invention.

Embodiments of the present invention are described below with reference to FIGS. 1 to 11. Hereinafter, for convenience of explanation, components having the same functions as the components described in a specific embodiment may be denoted by the same reference numerals and a description thereof may be omitted.

Embodiment 1

Embodiment 1 of the present invention is described below with reference to FIGS. 1 to 9.

FIG. 1 is a schematic diagram showing a configuration of an optical radar apparatus 100 according to the present embodiment <Configuration of Optical Radar Apparatus 100>

As shown in FIG. 1, the optical radar apparatus 100 includes a pulsed light illumination system 110 configured to irradiate a target visual field 10 with pulsed light 124, and a light receiving system 140 configured to receive light from at least a part of the target visual field 10.

The pulsed light illumination system 110 includes an illumination system power supply 120, a light emitting element drive circuit 121, a diffusion optical system 123, and a light emitting element 122. The diffusion optical system 123 simultaneously irradiates the entire target visual field 10 with the pulsed light 124 emitted from the light emitting element 122. The light emitting element drive circuit 121 is a circuit configured to perform pulse-driving on the light emitting element 122. The illumination system power supply 120 is a power supply that supplies power to the light emitting element drive circuit 121. The pulsed light illumination system 110 and the light receiving system 140 are disposed close to each other. However, it is desirable to have a structure such that the pulsed light 124 emitted from the pulsed light illumination system 110 does not leak into the light receiving system 140 except for reflected light coming back from the to-be-detected target object 11 in the target visual field 10.

The light receiving system 140 includes an imaging optical system 151, an optical bandpass filter 152, a three-dimensional image sensor 153, a control element 160, and a light receiving system power supply 157. The three-dimensional image sensor 153 includes a light receiving unit 154 and a signal storage processing unit 155. The imaging optical system 151 forms an image of the reflected light from the target visual field 10 on the light receiving unit 154 of the three-dimensional image sensor 153. The control element 160 controls the three-dimensional image sensor 153 and the pulsed light illumination system 110 and communicates with an external system 300. The light receiving system power supply 157 is a power supply configured to supply power to various parts in the light receiving system 140.

(Pulsed Light Illumination System 110)

The target visual field 10 generally has a rectangular shape characterized by a horizontal irradiation angle θh and a vertical irradiation angle θv. However, the shape is not limited to a rectangle, but the shape may be an ellipse. It is preferable that the pulsed light 124 is uniform in the target visual field 10. However, using the fact that the higher the light intensity, the higher the detection sensitivity, the pulsed light 124 may be distributed such that the light intensity is increased at a particular importance place in the target visual field 10.

The diffusion optical system 123 is an optical system configured to spread the light emitted from the light emitting element 122 into the target visual field 10. The diffusion optical system 123 includes a diffusion plate, a diffraction grating, a cylindrical lens, and the like.

The light emitting element 122 is a light source such as a laser or an LED capable of emitting pulsed light. It may be preferable that the wavelength of the emitted light is in an infrared range from about 700 nm to 1000 nm. As for the light emitting element 122, an infrared laser may be preferably used from the viewpoint that the emission wavelength band is narrow and the dependence of the change in the emission peak wavelength on temperature is small. In particular, VCSEL (Vertical Cavity Surface Emitting Laser) is preferable as the light emitting element 122 because the emission wavelength band is narrow and the dependence of the change in the emission peak wavelength on temperature is small. Although not shown in FIG. 1, a temperature control element for controlling the temperature of the light emitting element 122 may be added to the pulsed light illumination system 110 to suppress temperature-dependent change in the emission peak wavelength.

The light emitting element drive circuit 121 drives the light emitting element 122 to emit pulsed light by passing a predetermined current through the light emitting element 122 at a predetermined timing. The light emission timing is determined by a signal supplied from the control element 160. The amount of current passed through the light emitting element 122 may be variable or may be controlled by the control element 160. The same applies to the time-dependent change in the current that determines the emission time of the pulsed light 124.

Here, the full width at half maximum (time) of the pulsed light 124 is about 1 nsec to several hundreds nsec. The optical radar apparatus 100 needs high-power pulsed light 124 of several tens to several hundreds of watts. For this reason, the light emitting element drive circuit 121 generally accumulates charges in a capacitor and then discharges the charges to the light emitting element 122 at one burst so as to form short pulsed light. Therefore, the capacitor and the switching element may be combined with the light emitting element 122 in the form of a module.

The illumination system power supply 120 includes a normal low-voltage DC power supply for logic: circuits and a high-voltage DC power supply of several tens of volts for charging the capacitor. The pulsed light emission power can be controlled by controlling the output voltage of the high-voltage DC power supply or the charging time of the capacitor. The pulse width can be controlled by controlling the switching speed of the switching element. These controls can be performed by the control element 160.

(Light Receiving System 140)

Figure 2:
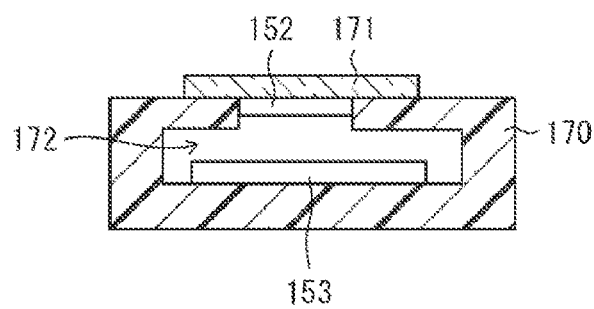
FIG. 2 is a cross-sectional view showing a package of a three-dimensional image sensor constituting the optical radar apparatus.
Figure 3:
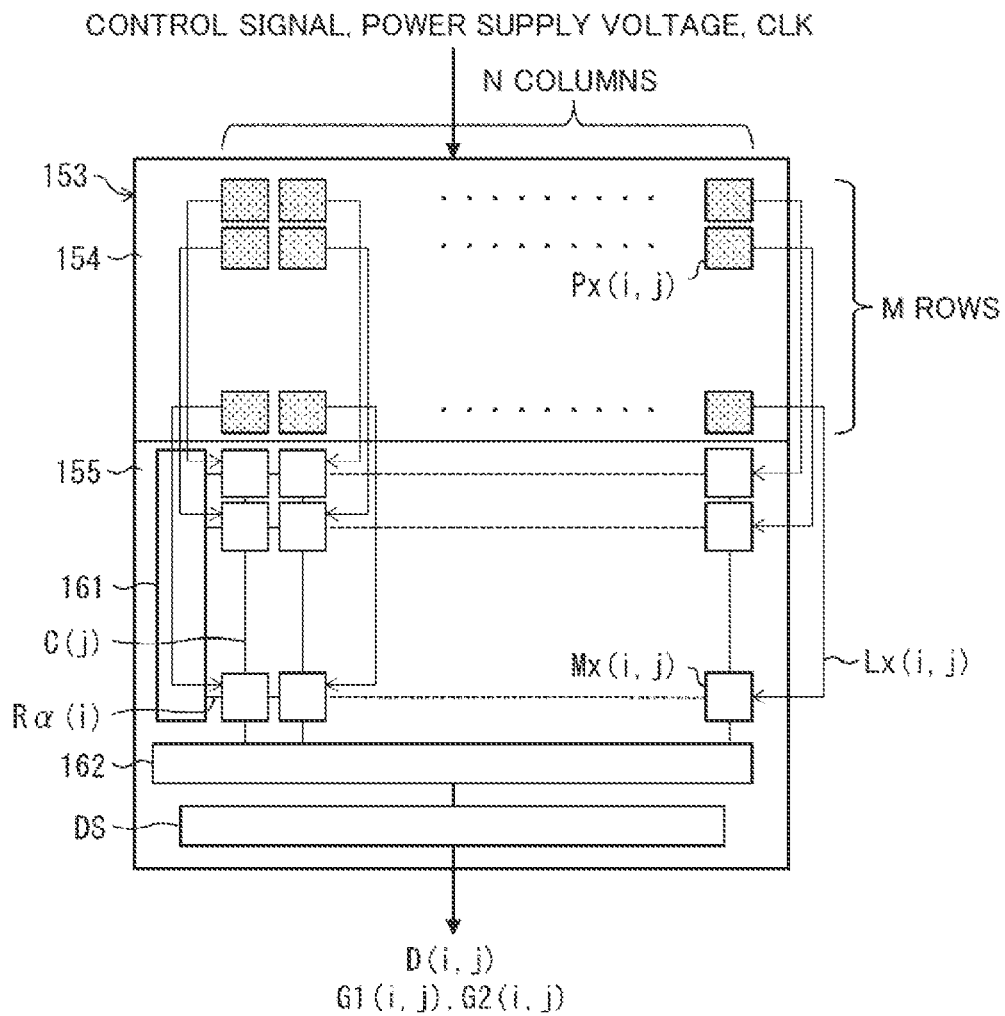
FIG. 3 is a block diagram showing a configuration of the three-dimensional image sensor.

FIG. 3 is a block diagram showing a configuration of the three-dimensional image sensor 153. FIG. 2 is a cross-sectional view of a package of the three-dimensional image sensor 153 constituting the optical radar apparatus 100 according to the present embodiment.

The imaging optical system 151 is generally a lens. The focal length and the F number may be selected depending on the size of the light receiving unit 154 and the viewing angle (FOV). It may be preferable that the transmittance is high and the aberration is small at the center wavelength of the optical bandpass filter 152 described later. Although the lens is used in FIG. 1, a reflective optical system other than a lens may be used instead of the lens.

The optical bandpass filter 152 has a transmission band with a particular bandwidth centered at a wavelength peak of the pulsed light. The width of the transmission band (full width at half maximum of the wavelength distribution of transmittance) is several nm to several tens of nm, and preferably about 10 nm to 20 nm. In general, in outdoor operation, the operating temperature range is large, and the peak wavelength of pulsed light changes with temperature in this large range. However, at least in the operating temperature range, the distribution of pulsed light has to be within the transmission band. In the case of VCSEL, the temperature shift of the peak wavelength is about 0.07 nm/degree, the full width at half maximum of the light emission peak is about 1 nm, and the temperature shift of the transmission band center wavelength of the optical bandpass filter is 0.025 nm/degree. Therefore, even for a large temperature range from 85° C. to −40° C., the relative wavelength shift between the peak wavelength and the transmission band center wavelength is as small as about 5.6 nm, and thus the transmission bandwidth for the optical bandpass filter 152 is about 10 nm.

In a case where a flat plate interference filter of a generally used type is used as the optical bandpass filter 152, the center wavelength of the transmission band shifts in a direction toward shorter wavelengths with increasing incident angle at which the reflected light is incident on the filter surface increases from 0 degrees. Therefore, when the viewing angle is wide, the flat plate transmission filter may not be able to ensure the same transmission wavelength band over the entire target visual field 10. Furthermore, it may be preferable to shield the flat plate interference filter from the outside air, because being exposed to moisture or oxygen for a long time may cause a change in properties and degradation with time.

In the light receiving system 140 shown in FIG. 1, a resin hemispherical dome transparent to infrared rays is provided as a protective cover 156 on a front surface of the imaging optical system 151 such that the light receiving system 140 is protected from the outside air. When the protective cover 156 is provided, for example, the optical bandpass filter 152 may be disposed on the surface of the imaging optical system 151 or on the inner surface of or in the inside of the protective cover 156. When the protective cover 156 is provided with the optical bandpass filter 152, the hemispherical diameter of the protective cover 156 may be set according to the diameter of the imaging optical system 151 such that a substantially constant transmission band is obtained for the reflected light coming from each direction in the target visual field 10. As the diameter of the hemisphere is larger, it is possible to more reduce the transmission band shift for the light focused on each pixel Px(i,j) described later, although an increase occurs in the outer shape of the optical radar device 100. Thus, the actual diameter of the hemisphere may be determined via a trade-off between the outer shape of the optical radar device 100 and the reduction in the transmission band shift. As for a practical range, the diameter of the hemisphere is preferably 5 times or more larger than the diameter of the diameter of the imaging optical system 151, and more preferably 10 times or more larger than the diameter of the imaging optical system 151.

In a case where the viewing angle is so narrow that the transmission band shift as described above is not so problematic, the optical bandpass filter 152 may be disposed on an inner side of a lid glass 171 as shown in FIG. 2. The lid glass 171 forms an optical window of the package 170 that seals the three-dimensional image sensor 153. The atmosphere 172 sealed inside the package 170 preferably does not include moisture and more preferably also does not include oxygen. This is to prevent the optical bandpass filter 152 from being degraded with time. For the above described purpose, the atmosphere 172 is preferably at least dry air, and more preferably nitrogen, argon, helium, or the like. Although not shown in FIG. 2, it is preferable to use a silicone resin with low oxygen and moisture permeation for bonding the lid glass 171 to the package 170.

The optical bandpass filter 152 may be incorporated in the imaging optical system 151. Although in FIG. 1 and FIG. 2, only one optical bandpass filter 152 is used, a plurality of optical bandpass filters 152 may be used. A first optical bandpass filter may be disposed on a front surface or a rear surface of the imaging optical system 151, and a second optical bandpass filter may be disposed on the inner surface of the lid glass 171 as described above. By providing the first optical bandpass filter, it becomes possible to obtain an effect that the optical energy of light incident on the package 170 is reduced, and rising of the temperature is suppressed. It is preferable that the transmission band of the first optical bandpass filter is set to be wider than the transmission band of the second optical bandpass filter.

The light receiving unit 154 and the signal storage processing unit 155 (the accumulating unit and the calculation unit) of the three-dimensional image sensor 153 may be formed on a silicon substrate. The light receiving unit 154 and the signal storage processing unit 155 may be formed on separate chips and connected together using vertical via holes, bumps, etc., into a multilayer structure. However, it is desirable that they are monolithically formed on the same silicon substrate. By forming the light receiving unit 154 and the signal storage processing unit 155 in a monolithic form, it becomes possible to reduce the production cost of the three-dimensional image sensor 153.

As shown in FIG. 3, the light receiving unit 154 and the signal storage processing unit 155 are respectively disposed in an upper area and a lower area as seen in FIG. 3. However, this is for the sake of convenience, and the light receiving unit 154 may be disposed at the center. However, it is not preferable that the light receiving unit 154 and the signal storage processing unit 155 are disposed in a mixed manner because the light receiving unit 154 exists over a wider area, which results in an increase in the size of the imaging optical system 151 and the size of the lid glass 171 and thus an increase in cost.

In the light receiving unit 154, pixels $Px(i,j)$ are arranged in a two-dimensional matrix having N rows and N columns. Each pixel $Px(i,j)$ has a function of detecting a photon by a SPAD and outputting a pulse signal (a pixel signal) as a photon detection result, as will be described later. All the pixels $Px(i,j)$ are configured identically.

(Signal Storage Processing Unit 155)

The signal storage processing unit 155 includes, at least, a plurality of pixel storage elements $Mx(i,j)$ (accumulating units) arranged in a matrix corresponding to the respective pixels $Px(i,j)$. The pixel storage elements $Mx(i,j)$ are connected to the respective corresponding pixels $Px(i,j)$ in a one-to-one manner via signal lines $Lx(i,j)$. Each time a photon is detected by a pixel $Px(i,j)$, a pixel signal (a pulse signal) is output as a photon detection result from the pixel $Px(i,j)$ and transmitted to a pixel storage element $Mx(i,j)$ via a signal line $Lx(i,j)$ and stored therein.

The signal storage processing unit 155 includes at least a row selection circuit 161 and a column selection circuit 162 (a switching circuit) for selecting a specific pixel storage element $Mx(i,j)$, and a signal processing circuit DS (a calculation unit). Based on information stored in the specific pixel storage element $Mx(i,j)$ selected by the row selection circuit 161 and the column selection circuit 162, the signal processing circuit DS calculates, as output signals, at least distance information $D(i,j)$ and two-dimensional image information $G1(i,j)$, $G2(i,j)$ (two-dimensional image information) and output them.

The two-dimensional image information $G1(i,j)$, $G2(i,j)$ is light intensity information indicating a light intensity of incident light (reflected light of the pulsed light) from the object 11 incident on the respective pixels $Px(i,j)$. This light intensity information identifies a two-dimensional image of the object 11 based on the light intensities in the detection range. The difference between the two-dimensional image information $G1(i,j)$ and $G2(i,j)$ will be described later.

More specifically, the signal storage processing unit 155 is configured as follows. In the signal storage processing unit 155, a row selection signal line $R\alpha(i)$ extends from, for example, a row selection circuit 161 to a pixel storage element $Mx(i,j)$ in the i-th row. When a specific row selection signal line $R\alpha(i)$ is activated, an $\alpha$th part (a binary counter $BC\alpha$ described later) of the pixel storage element $Mx(i,j)$ in the i-th row is selected. When a pixel storage element $Mx(i,j)$ belonging to the selected row outputs an output signal to a column signal line $C(j)$, the column selection circuit 162 selects the specific column signal line $C(j)$. As a result, the signal of the pixel storage element $Mx(i,j)$ is read into the signal processing circuit DS, and the distance information $D(i,j)$ and the two-dimensional image information $C(i,j)$, $G2(i,j)$ are output from the signal processing circuit DS.

The two-dimensional image information $G1(i,j)$ is two-dimensional image information (second light intensity information) of the object 11 obtained by background light that does not include reflected light of the pulsed light. The two-dimensional image information $G2(i,j)$ is two-dimensional image information (first light intensity information) of the object 11 obtained by the reflected light of the pulsed light. However, two-dimensional image information $G2(i,j)$ is not limited to this.

In the signal storage processing unit 155, reading of the output signal from the pixel storage element $Mx(i,j)$ can be performed in parallel with calculating the accumulated number of pulses of the pixel signal to the pixel storage element $Mx(i,j)$. This makes it possible to detect a pixel having a strong signal intensity at an early timing. In general, the pixel $Px(i,j)$ having a strong signal intensity captures the object 11 that is closer to the pixel $Px(i,j)$, and can detect the object 11 close to the three-dimensional image sensor at an early stage and issue an alarm.

The signal storage processing unit 155 stores readout orders of reading signals from the pixel storage elements $Mx(i,j)$, and can arbitrarily select one of the readout orders. This makes it possible to read, at an early stage, an accumulated value of photons from a pixel storage element $Mx(i,j)$ in which an accumulated value of photons obtained from a pixel $Px(i,j)$ that has detected reflected light from the object 11 located close to the three-dimensional image sensor.

(Light Receiving Unit 154)

Figure 4:
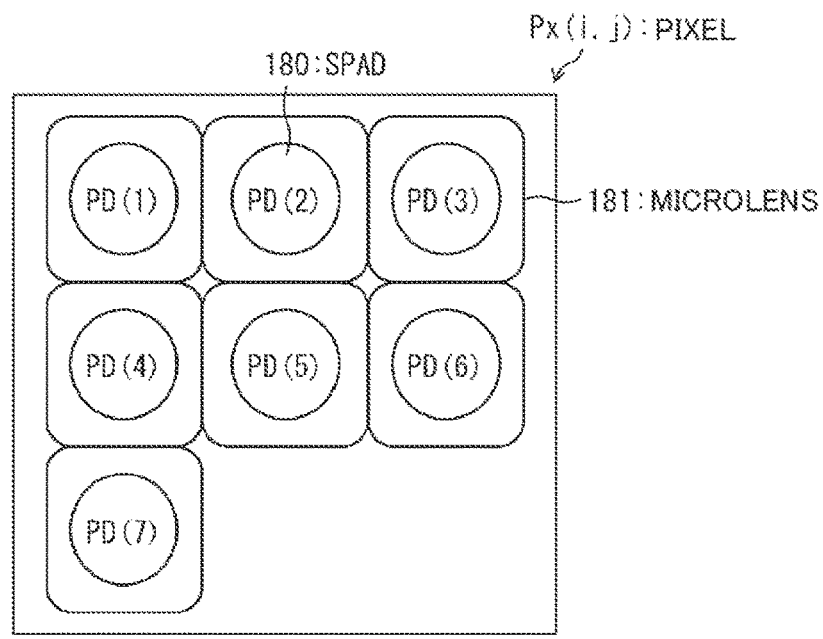
FIG. 4 is a plan view showing a pixel configuration of the three-dimensional image sensor.
Figure 5:
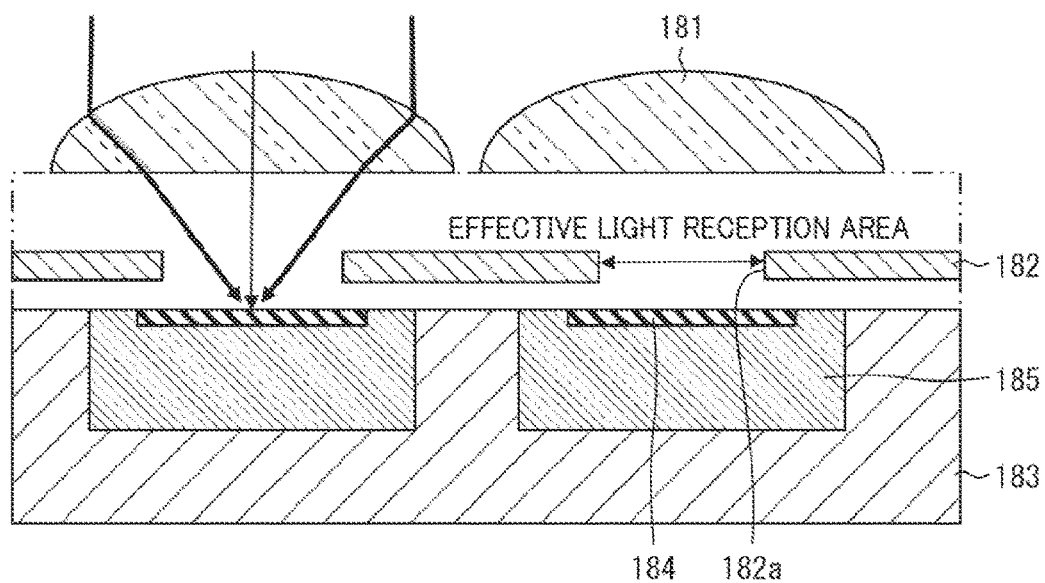
FIG. 5 is a cross-sectional view showing a pixel configuration of the three-dimensional image sensor.
Figure 6:
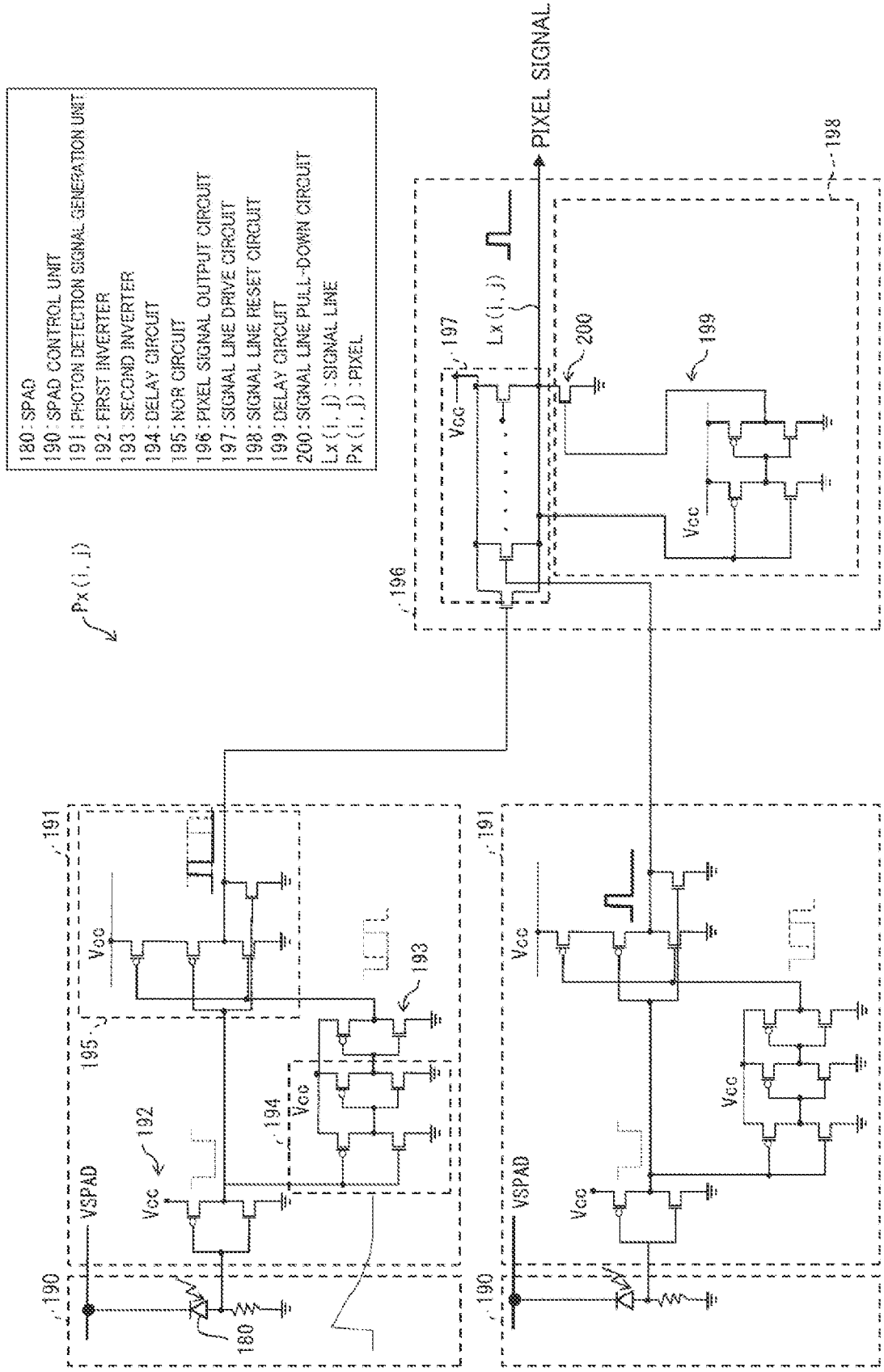
FIG. 6 is a circuit diagram showing a pixel configuration of the three-dimensional image sensor.

FIG. 4 is a plan view illustrating a configuration of pixels $Px(i,j)$ of the three-dimensional image sensor 153 FIG. 5 is a cross-sectional view illustrating a configuration of a pixel $Px(i,j)$. FIG. 6 is a circuit diagram illustrating a configuration of pixels $Px(i,j)$ of the three-dimensional image sensor 153.

The light receiving unit 154 includes a plurality of pixels $Px(i,j)$ arranged in a two-dimensional matrix having M rows and N columns. The light receiving unit 154 is supplied with a control signal, a power supply voltage, a clock CLK, and the like.

As shown in FIG. 4, each pixel $Px(i,j)$ includes one or a plurality of SPADs (Single-Photon-Avalanche-diode) 180. The SPAD 180 is a photodiode configured to detect photons of incident light in Geiger mode. Each SPAD 180 has a microlens 181 as shown in FIG. 5. The SPAD 180 may be formed in various structures, although a further detailed description is omitted.

The SPAD 180 is configured such that a $P^+$ diffusion layer 184 is formed on the surface of an N-type diffusion layer 185 formed on a silicon substrate 183. The surface of the silicon substrate 183 is covered with a metal shield 182 apart by a particular distance from the surface of the silicon substrate 183. The metal shield 182 has an opening 182a formed so as to expose a part of the $P^+$ diffusion layer 184. The opening 182a forms an effective light receiving area so as to allow light incident through the microlens 181 to pass to the $P^+$ diffusion layer 184.

Hereinafter each SPAD 180 is also denoted as a PD(a) (a=1 to Nspad, Nspad is the total number of SPADs 180 belonging to one pixel). In FIG. 4, SPADs 180 are arranged at almost the same distance from each other except in a lower right area of the pixel where a circuit such as an output circuit is disposed. This arrangement is employed to focus of light over as large area as possible via the microlens 181 thereby achieving an increase in detection sensitivity. However, if the sensitivity is sufficient and the circuit layout allows the pixel area to be reduced, SPADs 180 may be disposed in a concentrated manner in a certain range.

The optimum total number Nspad of SPADs varies depending on the number of photons Md received by one pixel during the deadtime Td of the SPAD 180 used. The deadtime Td is a time during which each SPAD is not capable of detecting a photon after detecting a photon till detecting a next photon, and the deadtime T is literally the length of time during which the SPAD does not function as a sensor. In general, the length of the deadtime Td is about several nsec to 100 nsec. When Md<<1, the total number of SPADs Nspad may be small or may be equal to one. However, in a case where the number of photons Md can exceed 1, when the first one photon is counted by one SPAD 180, it becomes impossible for the SPAD 180 to count photons during a next Td period, and thus the maximum number of photons that can be counted is 1. Thus, it is impossible to correctly count the number of photons Md of received light. Therefore, when the number of photons Md is close to 1 or is larger than 1, it is needed to increase the total number of SPADs Nspad. When the fill factor (the ratio of the total area of the effective light receiving areas to the pixel area) is the same, the detection sensitivity increases as the total number of SPADs Nspad increases.

As shown in FIG. 6, the pixel Px(i,j) includes SPAD control units 190 and photon detection signal generation units 191 provided in the respective SPADs 180. FIG. 6 illustrates the SPAD control unit 190 and the photon detection signal generation unit 191 and also illustrates waveforms of signals output from these respective units.

The SPAD control unit 190 is a circuit configured to apply a power supply voltage VSPAD to the SPAD 180 and also configured such that when a photon is detected in a pixel Px(i,j), quenching is performed so as to return to the measurement state after a deadtime Td. In FIG. 6, the SPAD control unit 190 is configured in a simple circuit in which one resistor R is added to the SPAD 180 so as to function to perform non-active quenching. However, an active quenching circuit may be employed. It is also possible to add various circuits such as a circuit for controlling the activation of SPAD 180.

The photon detection signal generator 191 is a circuit configured such that when the SPAD 180 detects a photon, the photon detection signal generation unit 191 detects an increase in a terminal voltage of the SPAD 180 and outputs one pulse having a particular width. In the example shown in FIG. 6, the photon detection signal generation unit 191 includes a first inverter 192, a second inverter 193, a delay circuit 194, and a NOR circuit 195. Although in the example shown in FIG. 6, the delay circuit 194 is configured with two stages of inverters, it may be configured with four or more even number of stages, or it may be formed in other circuit configurations. The delay time provided by this delay circuit 194 determines the pulse width. The delay time is preferably about 0.1 nsec to several nsec. The NOR circuit 195 outputs logical NOR between the output of the first inverter 192 and the output of the second inverter 193.

The pixel Px(i,j) includes a pixel signal output circuit 196 shared by the photon detection signal generation units 191. The pixel signal output circuit 196 is a circuit configured to receive photon detection signals from respective SPADs 180 in parallel and send a pulse having a length approximately equal to the length of photon detection signals over a signal line Lx(i,j). In a case where a plurality of SPADs 180 output photon detection signals almost simultaneously, they cannot be distinguished. In order to minimize occurrence of such a case, the pulse width of the signal passing through the signal line Lx(i,j) may be set to be as short as possible. In the example shown in FIG. 6, the pixel signal output circuit 196 includes a signal line drive circuit 197, a signal line reset circuit 198, and a delay circuit 199. However, the configuration of the pixel signal output circuit 196 is not limited to this ex ample.

The signal line drive circuit 197 is a circuit configured to, in response to receiving a photon detection signal, supply a current to the signal line Lx(i,j) so as to increase the potential of the signal line Lx(i,j) thereby outputting a pixel signal. The signal line drive circuit 197 operates completely in parallel for the photon detection signals. The pixel signal is a pulse signal corresponding to the photon detection signal.

In the example of the configuration of the signal line drive circuit 197 shown in FIG. 6, NMOS transistors are connected in parallel and the gates of the respective NMOS transistors receive outputs from the photon detection signal generation units 191. However, the configuration of the signal line drive circuit 197 is not limited to this example. For example, the signal line drive circuit 197 may be configured to receive, with an AND circuit, an output from each photon detection signal generation unit 191 and turn on one NMOS transistor having a large driving capability by the output of the AND circuit.

The signal line drive circuit 197 has a capability of driving the signal line Lx(i,j) with a small delay time so as to transmit a signal to the pixel storage element Mx(i,j). This delay time is determined by the driving capability of the transistor provided in the signal line drive circuit 197 relative to parasitic capacitance of the signal line Lx(i,j). This delay time is preferably at least equal to or less than the pulse width of the pulse signal generated by the photon detection signal generation unit 191.

In order to achieve as short an electric pulse width as possible for the pulse passing through the signal line Lx(i,j), it is preferable that the signal delay time along the signal line Lx(i,j) is short and the length of the signal line Lx(i,j) is short. The signal line Lx(i,j) may be shortened by dividing the signal storage processing unit 155 at least into two parts located on two sides of the light receiving unit 154.

The signal line reset circuit 198 is a circuit that restores the potential of the signal line Lx(i,j) after being raised by the signal line drive circuit 197. Here, the signal line reset circuit 198 includes the delay circuit 199 that delays the signal on the signal line Lx(i,j) and a signal line pull-down circuit 200, but other configurations may be used. In order that the potential falls down quickly after the potential of the signal line Lx(i,j) rises up and the image storage element Mx(i,j) reacts thereto, after the delay time provided by the delay circuit 199 passes, the signal line pull-down circuit 200 connects the signal line Lx(i,j) to a ground wiring at a ground level such that the potential of the signal line Lx(i,j) drops down. Although the delay circuit 199 described above is formed in a two-stage inverter chain configuration, it may be configured using an inverter chain having four or more even-numbered stages.

In FIG. 6, the photon detection signal is a pulse that rises from the ground level to the Vcc level. However, the same function can be achieved using a pulse that falls down from the Vcc level to the ground level. In the configuration shown in FIG. 6, the pulse width of the pixel signal passing through the signal line Lx(i,j) is mainly determined by the photon detection signal generation unit 191. However, the configuration may be such that the pulse width is determined by the pixel signal output circuit 196. In FIG. 6, the signal line Lx(i,j) is a single line. However, a plurality of signal lines may be provided. For example, the signal line Lx(i,j) may include a pair of two wires, and a photon detection signal may cause the pixel signal output circuit 196 to generate a potential difference between the pair of two wires and the potential difference between the pair of wires propagate along the signal line Lx(i,j) In a case where the total number of SPADs, Nspad, is large, the pixel signal output circuit 196 may be divided into a plurality of circuits, and a signal line may be provided for each of them.

(Pixel Storage Element Mx(i,j))

Figure 7:
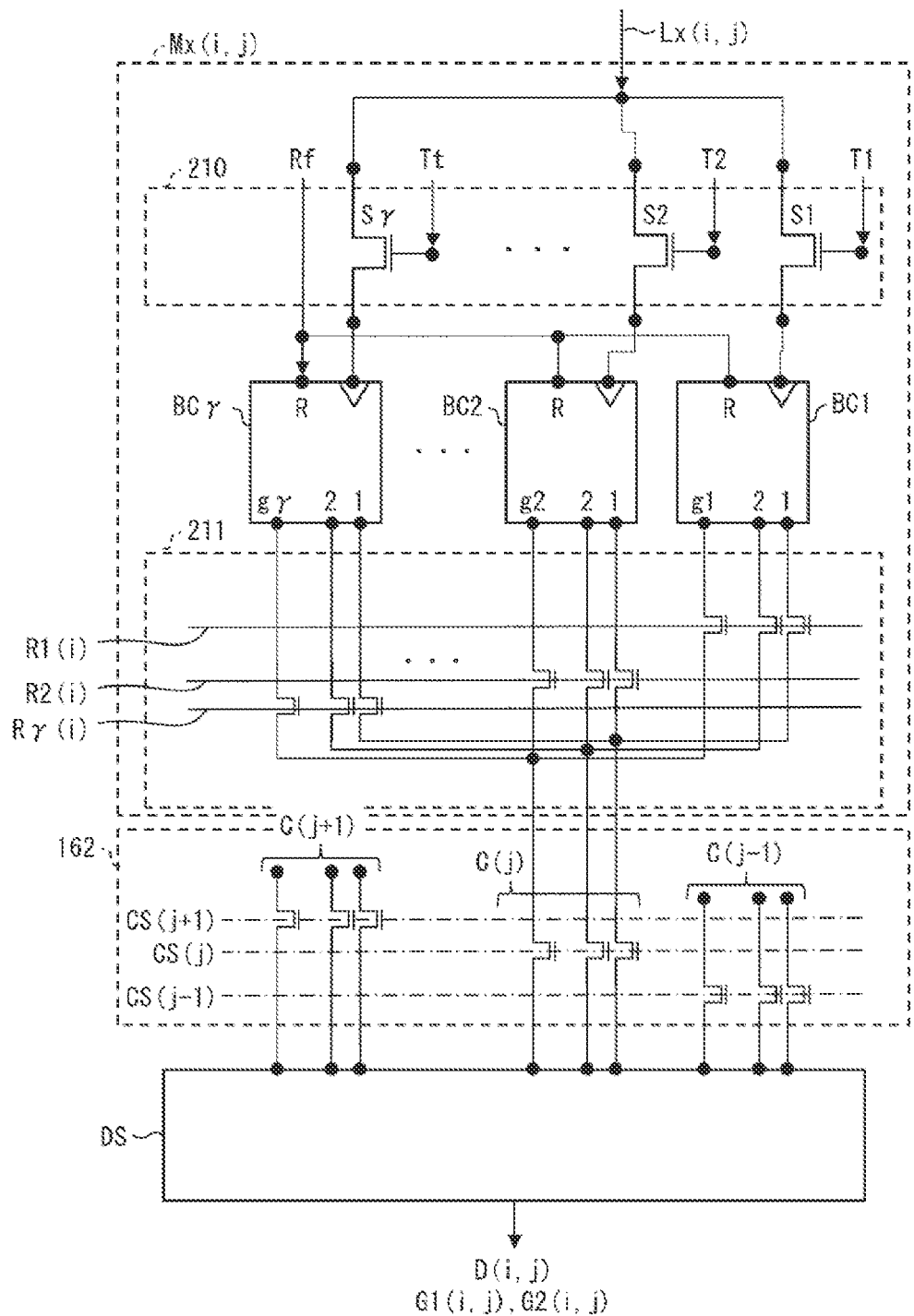
FIG. 7 is a circuit diagram illustrating a circuit configuration of a pixel storage element, a column selection circuit, and a signal processing circuit in the signal storage processing unit in the three-dimensional image sensor.

FIG. 7 is a circuit diagram illustrating configurations of the pixel storage element Mx(i,j), the column selection circuit 162, and the signal processing circuit DS in the signal storage processing unit 155. FIG. 8(a) is a timing chart illustrating a timing of driving the pixel storage element Mx(i,j). FIG. 8(b) is a waveform diagram illustrating reflected pulsed light in an enlarged manner.

As shown in FIG. 7, the pixel storage element Mx(i,j) includes a plurality of binary counters BC1 to BCγ, a time switch 210, and an output switch 21. In the following description, when the binary counters BC1 to BCγ are described generically for a representative one, the representative one is denoted as a binary counter BCα.

The time switch 210 is a circuit including switches S1 to Sγ that connect the signal lines Lx(i,j) selectively to the binary counters BC1 to BCγ. In FIG. 7, the switches S1 to Sγ are realized by NMOS transistors. In the following description, when the switches S1 to Sγ are described generically for a representative one, the representative one is denoted as a switch Sα.

The binary counters BC1 to BCγ are counters that count pixel signal pulses from pixels Px(i,j) input via the respective switches S1 to Sγ. The above pulses are input to the clock terminals of the respective binary counters BC1 to BCγ. A reset signal R is input to reset terminals R of the binary counters BC1 to BC γ. Furthermore, the binary counters BC1 to BCγ respectively have output terminals of g1 bits, g2 bits, . . . , gγ bits.

The output switch 211 is a circuit configured such that when it is selected by a row selection signal line Rα(j) (row selection signal lines R1(j), R2(j), . . . , Rγ2(j)), the output switch 211 connects the output of the binary counter BCα to the column signal line C(j). In FIG. 7, the output switch 211 is configured using NMOS transistors having gates connected to the row selection signal lines Rα(j) but the configuration is not limited to this example. One terminal of each NMOS transistor in the output switch 211 is connected to the output terminal of each bit of the binary counter BCα, and the other terminal is connected to the column signal line C(j). The binary counter BCα is connected to the signal line Lx(i,j) for a time width ΔTα during which the switch Sα is on, and calculates the accumulated number of pulses transmitted from the pixel Px(i,j). The number of output bits gα of the binary counter BCα is determined by the maximum number of photons to be measured.

The column selection circuit 162 is a circuit configured to, when it is selected by a column selection signal line CS(j), to connect a column signal line C(j) to the signal processing circuit DS. In FIG. 7, the column selection circuit 162 is configured using NMOS transistors having gates connected to column selection signal lines CS (j), but the configuration is not limited to this example. Furthermore, the column selection circuit 162 connects column signal lines C(j+1), C(j−1) and the like arranged in parallel to the signal processing circuit DS. The order of reading the accumulated values of the number of photons from the pixel storage elements Mx(i,j) is determined by the order of selecting the output switch 211 by the row selection signal lines Rα(j) and the order of connecting the signal lines C(j) by the column selection circuit 162.

The signal processing circuit DS is capable of reading the output of the binary counter BCα via the output switch 211 and the column signal line C(j) of the column selection circuit 162 even during the accumulating operation by the binary counter BCα.

Signals T1 to Tγ for driving the time switch 210 are signals for time-serially turning on the switches S1 to Sγ as shown in FIG. 8(a). In FIG. 8(a), by way of example but not limitation, the time widths ΔT1 to ΔTγ (temporally successive time intervals) for turning on the switches S1 to Sγ are equal to a full width at half maximum ΔT of the pulsed light. The binary counters BC1 to BCγ respectively count pulses and determine the accumulated number of photons for respective time periods determined by the time width ΔT1 to ΔTγ.

Note that the switch S1 turns on before the pulsed light is emitted, and thus the binary counter BC1 measures the background light intensity. Therefore, the time width ΔT1 during which the switch S1 is on does not have to be the same as the on-time ΔTα of the other switches Sα. For example, the noise level of the binary counter BC1 may be reduced by setting the length of the on-time of the switch Δ1 to be multiple times as long as the on-time of the other switches Sα. In this case, in the signal processing circuit DS, only the output value of the binary counter BC1 is divided by a multiple of the on-time, by which the on-time is longer than the on-time of other switches Sα, to obtained a value which would be if the time length is equal to that of the other binary counters BCα. Thus, additional processing is required.

The time widths ΔT2 to ΔTγ are preferably equal to or less than the full width at half maximum ΔT. This makes it possible to reduce the influence of background light and improve the signal-to-noise ratio of the signal. On the contrary, when the time widths ΔT2 to ΔTγ are longer than the full width at half maximum ΔT, the influence of background light becomes strong, and the signal-to-noise ratio of the signal decreases. For example, in a case where the time widths ΔT2 to ΔTγ have a length twice as long as the full width at half maximum ΔT, the background light measurement time is twice as long as the time during which reflected liqht of the pulsed light may be detected. Therefore, the intensity ratio of the reflected light of the pulsed light to be detected to the background light is ½ compared to a case where the time widths ΔT2 to ΔTγ are substantially equal to the full width at half maximum ΔT. Therefore, the detection sensitivity becomes low for a distant object 11 from which the pulsed light comes back as reflect light with lower intensity than the background light.

The switch S2, which will be described later, turns on simultaneously with the emission of pulsed light, and thus the binary counter BC2 receives an input signal corresponding to pulsed light reflected back in an extremely short time. That is, when the object 11 is located very close to the three-dimensional image sensor 153, the number of counts counted by the binary counter BC2 is greater than the number of counts counted by the binary counter BC1. When the distance between the object 11 and the three-dimensional image sensor 153 is given by L, the reflected light of the pulsed light reaches the three-dimensional image sensor 153 after an elapsed time of 2 L/c (c=speed of light), and thus corresponding one or two binary counters (binary counters BC3 and BC4 in the example shown in FIG. 8(a)) receive a light reception signal having a higher intensity than the background light.

The above-described accumulating operation is executed for a plurality of pulses of light emitted during one frame (for example, 1/30 sec). That is, temporally successive count numbers are acquired by the three-dimensional image sensor each time a plurality of pulses of light is emitted, and the count numbers are accumulated together. At the end of one frame, data stored in each binary counter BCα is read out to the signal processing circuit DS and then an activation is performed by the reset signal Rf. Thus, the counted value is cleared, and the binary counter BCα becomes ready to start measurement for a next frame.

The total number of binary counters γ has a following relationship with the maximum measurement distance Dmax and the full width at half maximum ΔT.

$$D\max < (\gamma - 2) \cdot c \cdot T/2$$

The reason why the above expression is not an equality is explained below with reference to an example. Let it be assumed here by way example that Dmax=30 m, ΔT=100 nsec, and γ=4. The reflected pulses from the object 11 at a distance of 30 m are counted by the binary counter BC4. However, even when the number of counts by the binary counter BC4 is significantly larger than the number of counts by the binary counter BC1, if the number of counts by the binary counter BC5 is not substantially equal to the number of counts by the binary counter BC1, it cannot be determined that the distance is 30 m, and thus it is not concluded that 30 m is obtained as a result of the measurement. On the other hand, when the distance is less than 30 m, there is a case in which BC3 is significantly larger than BC1 and the distance can be measured from BC3 and BC4.

The distance measurement accuracy can be improved by reducing the full width at half maximum ΔT and increasing the total number of binary counters γ. In particular, by detecting a plurality of peaks, there is a possibility of detecting multiple reflections or simultaneously detecting a light transmissive object and an object 11 located behind the light transmissive object. On the other hand, when the total number of binary counters γ increases, the area of the pixel storage element Mx(i,j) increases, which may cause an increase in the area of the chip constituting the three-dimensional image sensor 153 and an increase in cost of the optical radar apparatus 100. However, since the pixel storage element Mx(i,j) and the signal processing circuit DS are basically logic circuits, the area can be reduced by adopting advanced silicon LS1 micro-fabrication technology. The production cost of such a micro-fabrication process is decreasing year by year, and thus the total number of binary counters γ can be increased to tens to hundreds in the future.

In principle, as shown in FIG. 8(a), pulse widths may be selected arbitrarily as long as the signals T1 to Tγ do not overlap with each other and completely cover the entire time zone to be measured. However, in FIG. 8(a), the activated pulse widths are set to be equal to each other, since this allows it to simply the signal processing. However, the activated pulse widths do not necessarily need to be equal to each other. For example, in order to improve the distance measurement accuracy for a short distance range, the pulse width may be shortened in a starting period of the lapse of time and gradually increased with the lapse of time, or may be changed in steps. Since the signals T1 to Tγ need to be distributed to all pixel storage elements Mx(i,j), there is a possibility that a slight error occurs due to variations in the delay among the wirings. The error in the pulse width of activated signals T1 to Tγ is directly related to the accuracy of the distance measurement value. Therefore, it is necessary to adopt a circuit configuration and wiring arrangement that provide high time accuracy depending on the accuracy required for the optical radar apparatus 100.

In the example shown in FIG. 7, the switches S1 to Sγ constituting the time switch 210 are turned on/off directly by the signals T to Tγ. However, the time switch 210 may be formed in other circuit configurations. For example, outputs of a simple shift register (the number of bits=γ) may be connected to the respective switches S1 to Sγ, and the ON state may be sequentially shifted in response to the clock signal. This configuration results in a reduction in the number of signals. Besides, it is ensured that only one of the switches 31 to Sγ is turned on. Thus, the counting error can be reduced by preventing an overlap or gap from occurring between adjacent on-time periods for the switch Sα and the switch S(α+1) that are adjacent to each other in terms of the ON time period. The time switch 210 may be formed in any circuit configuration as long as the gap and overlap in on-time between adjacent switches are small.

In the above description, the binary counter BCα is used as a circuit for counting time-serial pulse signals generated when the light receiving unit 154 detects a photon. The reason for this is that the binary counter BCα can be configured with a relatively simple circuit, and when configured as an integrated circuit, a function of counting and accumulating counts can be realized in a small area. Another reason is that since the binary counter BCα is a simple logic circuit, it is easy to obtain a wide operation margin, and the design thereof is easy. The binary counter BCα has such advantages, but the pixel storage element Mx(i,j) does not necessarily need to be configured using a plurality of binary counters BC1 to BCγ. Any other configuration may be used as long as it is capable of, in cooperation with the time switch 210, accumulating the number of detected photons for each time interval in a series of time intervals that are substantially successive in time. Furthermore, it is preferable that an intermediate result of the accumulated value can be read out in the middle of the accumulating operation without imposing a significant influence on the accumulating operation.

(Signal Processing Circuit DS)

Functions of the signal processing circuit DS are described below with reference to an example shown in FIG. 8(a). Regarding the numbers of counts NCα(t) at a certain time t (a time series of groups of accumulated values) by the respective binary counters BCα in the example shown in FIG. 8(a), the numbers of counts NC1(t), NC2(t), and NC5(t) are almost equal to each other within an error of noise, and these values represent background light intensities. In contrast, the numbers of counts NC3(t) and NC4(t) include contributions by reflected light of pulsed light, and are significantly larger than the numbers of counts NC1(t), NC2(t), and NC5(t). Thus, the distance between the light receiving unit 154 and the object 11 is calculated according to the following equation.

$$D(t)=c\cdot\Delta T\cdot[1+\{NC4(t)-NC1(t)\}/\{NC3(t)+NC4(t)-2\cdot NC1(t)\}]/2$$

The meaning of the above formula is described below with reference to FIG. 8(b). "1" in [ ] is a value obtained as a result of dividing the period Ta, which is a part of a time until the reflected light of the pulse light is incident, by the full width at half maximum $\Delta T$ of the pulsed light. That is, this value represents a portion corresponding to an integer multiple of the full width at half maximum $\Delta T$ in a time from the start of pulsed light emission until the reflected light is incident (with the same accuracy in length as the time interval). This value is, in the example shown in FIG. 8(b), "1". Note that the above value is an integer greater than or equal to 0, and this integer is large when the object is located at a long distance. Conversely the integer is small when the object is located at a short distance. The terms in [ ] other than the integer correspond to the period Tb (with accuracy shorter than the time interval). That is, the value obtained by dividing the period Tb by the full width at half maximum $\Delta T$ is equal to a value obtained by dividing B NC4(t)–NC1(t)) by the sum of A (=NC3(t)–NC1(t)) and B in FIG. 8(b). Therefore, the length of the period Tb is given by $\Delta T\cdot B/(A+B)$. A is the integrated value of the reflected pulsed light intensity measured during a timing T3, and B is an integrated value of the reflected pulsed light intensity measured during a timing T4. Since the pulse width of the pulsed light and the measurement time length are the same, the reflected light is detected only in at most two adjacent intervals as shown in FIG. 8(b). Therefore, the length of the period Tb can be calculated from the intensity of the reflected light of the pulsed light in a similar manner regardless of the distance of the object. In the above equation, the division by 2 is performed because light travels back and forth in the distance to the object 11 in the time period equal to the sum of the period Ta and the period Tb, and thus the distance to the object 11 is given by dividing the round-trip distance by 2.

The signal processing circuit DS is capable of outputting D(t) as the distance signal D(i,j) for each pixel Px(i,j) Furthermore, the signal processing circuit DS is capable of outputting the two-dimensional image information G1(i,j), G2(i,j) as described below.

Backgroundd light signal: G1(i,j)=NC1(t)

Reflected light signal of pulsed light: G2(i,j)=1C(t)=NC3(t)+NC4(t)–2·NC1(t)

As described above, in the present embodiment, the accumulated value of counts of pulses $NC\alpha(t)$ greater than the noise level is determined, and, for a period temporally adjacent to this period, the accumulated value is also determined. From the numbers of counts for these two periods, the distance to the object can be calculated with accuracy shorter than the time interval. In a method, as with TCSPC, in which the flight time is determined simply from the time period in which the maximum value of $NC\alpha(t)$ occurs, the accuracy of the time of flight of light is given by $c\cdot\Delta T/2$ (the integer term in [ ] of D(t)). Therefore, to improve the accuracy of time-of-flight measurement in the method such as TCSPC, it is necessary to reduce $\Delta T$ and increase the number of $NC\alpha(t)$. However, this results in an increase in the circuit scale, which results in an increase in an area of the signal storage processing unit 155. This results in an increase in cost. In contrast, in the present embodiment, a plurality of temporally adjacent $NC\alpha(t)$ are used to determine the time of flight of light with accuracy of $c\cdot\Delta T/2$ or less (the terms other than the integer term in [ ] of D(t)) without reducing $\Delta T$ and without increasing the number of $NC\alpha(t)$. Thus, an improvement in the accuracy of measurement of the distance to the object can be achieved.

<Signal Processing by Signal Processing Circuit DS>

Figure 9:
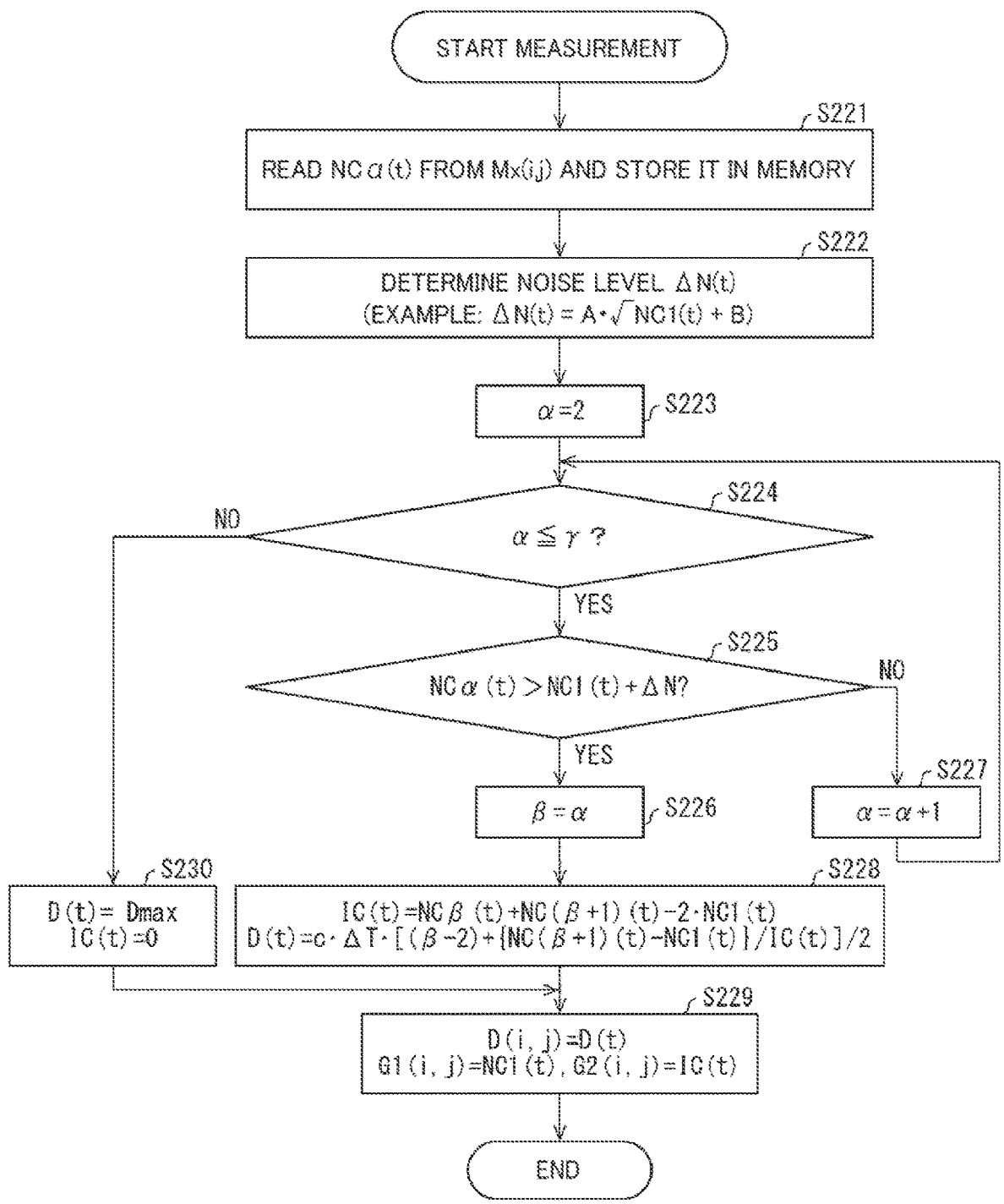
FIG. 9 is a flow chart illustrating a procedure of signal processing by a signal processing circuit in the three-dimensional image sensor.

Basically, the output signal is measured based on the method described above. However, the actual count value includes noise, and thus more careful consideration is necessary. FIG. 9 is a flow chart illustrating a procedure of signal processing by the signal processing circuit DS.

A measurement on the pixel Px(i,j) is described below. The signal processing circuit DS may serially process the output signals from the pixels Px(i,j). Instead, a plurality of operation circuits may be provided in the signal processing circuit DS, and the output signals of the pixels Px(i,j) may be processed in parallel.

First, the signal processing circuit DS reads out the numbers of counts NC1(t) to NCγ(t) from the pixel storage elements Mx(i,j), and stores them in a memory disposed in the signal processing circuit DS (step S221). When the number of counts $NC\alpha(t)$ is small, noise cannot be ignored. Therefore when a difference is smaller than the noise level $\Delta N(t)$, this difference cannot be regarded as significant. In view of the above, the signal processing circuit DS determines the noise level $\Delta N(t)$ (step S222).

Usually, there are various noises such as dark current noise, 1/f noise, thermal noise, etc., but the largest noise in the measurement of the number of photons is shot noise. Usually, when the number of detected photons is given by N (average value), associated shot noise proportional to $\sqrt{N}$ occurs. Therefore, basically, the number of counts $NC\alpha(t)$ must be regard as having noise proportional to $\sqrt{NC\alpha(t)}$. In particular, in a case where it is necessary to find a signal that is significantly larger than the background light, the signal cannot be significantly large unless the signal is larger than the number of counts NC1(t) by a noise level $\Delta N(t)=A\cdot\sqrt{NC1(t)}$ (A is a constant).

A more strict condition may be given by an equation described below.

$$\Delta N(t)=A\cdot\sqrt{NC1(t)}+B (B \text{ is a constant})$$

In the above formula, $A\geq 1$, and $B\geq 0$. By increasing A, it is possible to reduce false detection of mistaking a signal due to shot noise as an object. In order to reduce such erroneous detection to a negligibly small level, A is preferably set to be equal to or larger than 3, and more preferably equal to or larger than 4. B is a noise component such as dark current noise other than shot noise.

In the above description, the noise level $\Delta N(t)$ is determined based on the number of counts NC1(t) that does not include the reflected light of the pulsed light but includes only the background light signal. However, other methods may be used in determining the noise level $\Delta N(t)$ For example, the number of counts NCγ(t) is determined from the number of counts NC2(t) without measuring the number of counts NC1(t), and, based on the average value Ave ($NC\alpha(t)$) of the numbers of counts from the number of counts NC2(t) to the number of counts NCγ(t), the noise level may be calculated according to an equation described below.

$$\Delta N(t)=A\cdot\sqrt{Ave(NC\alpha(t))}+B$$

In many cases, in the numbers of counts NCγ(t) measured on and after the numbers of counts NC2(t), the number of counts including the reflected light signal of the pulsed light is one or two, and in many cases numbers of counts contain only background light signals. Therefore, Ave (NCα(t)) is very close to the average value of background light. As γ increases, the difference between the average value of the background light signal and Ave(NCα(t)) decreases. In other words, the above formula over evaluates the noise level ΔN(t), that is, the noise level ΔN(t) is estimated to be larger than is actual value, this results in a reduction in an occurrence of false detection. In calculating the average value of NCα(t), the average value may be calculated from part of NC2 to NCγ instead of all of NC2 to NCγ. In a case where ΔN(t) is determined using Ave(NCα(t)), BC1 for obtaining NC1(t) can be omitted.

However, in this method, if a strict value of the square root is calculated, a large circuit scale and a long calculation time are needed. To avoid the above situation, an approximate value may be used. For example, when the most significant bit of the number of counts NC1(t) is in a k-th digit, a number having a most significant bit in a k/2-th digit (rounded up if k is an odd number) may be employed as the noise level ΔN(t), or a number, in which a most significant bit is in a k/2 digit (rounded up if k is odd) and a directly-lower bit is also equal to 1, may be employed as the noise level ΔN(t), or other approximation methods may be used.

Next, a loop process is performed to search for a number significantly larger than the number of counts NC1(t) from the number of counts NC2(t) to the number of counts NCγ(t) (steps S223 to S226). The signal processing circuit DS sets the initial value of α to, for example, 2 at the beginning of the first iteration of the loop processing (step S223), and then determines whether α is equal to or smaller than the total number of binary counters γ (step S224). In a case where the signal processing circuit DS determines in step S224 that α is equal to or smaller than the total number of binary counters γ (YES in step S224), then further determines whether for this value of α satisfies a condition represented by a formula described below (step S225).

$NC\alpha(t) > NC1(t) + \Delta N$

In a case where the signal processing circuit DS determines in step S224 that the above condition represented by the formula described above is satisfied for α described above (YES in step S225), the signal processing circuit DS employs this value of α as β (step S226). In a case where the signal processing circuit DS determines in step S224 that the above condition represented by the formula described above is not satisfied for α described above (NO in step S225), the signal processing circuit DS1 adds 1 to this value of α (step S227), and returns the process to step S224. The number of counts NCβ(t) is an accumulated value of counts of values greater than the noise level, and the number of counts NC(β+1)(t) is an accumulated value of counts for a temporally adjacent period. Thus, a pair of number of counts NCβ(t) and the number of counts NC(β+1)(t) is extracted.

After β is determined, the signal processing circuit DS calculates the measurement result according to the following equation (step S228).

$IC(t) = NC\beta(t) + NC(\beta+1)(t) - 2 \cdot NC1(t)$ $D(t) = c \cdot \Delta T \cdot [(\beta-2) + \{NC(\beta+1)(t) - NC1(t)\}/1C(t)]/2$ As a result of the calculation described above, the signal processing circuit DS obtains distance information D(i,j) and two-dimensional image information G1(i,j), G2(i,j) described below (step S229) The signal processing circuit DS stores the calculated distance information D(i,j) and the two-dimensional image information G1(i,j), G2(i,j) in a memory and outputs them to the external system 300 as required.

In a case where the signal processing circuit DS determines in step S224 that α is greater than the total number of binary counters γ (NO in step S224), the signal processing circuit DS determines that there is no object 11 in the measurable range. In this case, the signal processing circuit DS outputs, as a result, D(t)=Dmax and 1C(t)=0 (step S230). The process then proceeds to step S229.

In this way, the signal processing circuit DS calculates the distance information D(i,j) and the two-dimensional image information G1(i,j), G2(i,j), stores them, and outputs them to the external system 300. Note that the specific calculation method of the distance information D(i,j) and the two-dimensional image information G1(i,j), G2(i,j) by the signal processing circuit DS is not limited to the example described above, but various algorithms may be employed.

Effects of the Present Embodiment

In the present embodiment, in the three-dimensional image sensor 153, the cumulative sum of measurement results (number of photons) for many laser light pulses is determined by the binary counters BCα thereby achieving an improvement in SN ratio and obtaining the distance information. For example, when the intensity of the background light is 100, the shot noise of the background light is on the order of √100=10. When the intensity of the reflected light of the pulsed light is 10, the intensity of the reflected light is almost the same as the noise of the background light and cannot be reliably detected by one measurement. However, if the results are cumulatively added for 100 measurements, then the intensity of the background light is 10000, and the shot noise is on the order of 100. On the other hand, the intensity of the reflected light of the pulsed light is 1000, which is an order of magnitude larger than the noise of the background light, and which can be reliably detected. In the present embodiment, a mechanism of determining the cumulative sum described above for all pixels Px(i,j) digitally and in parallel can be realized using silicon. Therefore, it is possible to provide, at low cost, the optical radar apparatus 100 that provides an extended distance measurement range even in an environment in which there is strong background light.

In the present embodiment, the pixel storage element Mx(i,j) is capable of executing, in parallel, a function in which the binary counter BCα counts the number of photons detected as electric pulses by the pixel Px(i,j) and a function in which the signal processing circuit DS reading reads out a result of the counting. This makes it possible to read out the measurement result even in the middle of one frame without having to wait for the one frame to be completely measured.

For example, when the frame frequency is 30 Hz, a time of 1/30 (seconds) can be used to acquire one frame of data. When the pulse emission period is 18 kHz, 600 (==1/30×18,000) pulse emissions can be accumulated in obtaining one frame of data. When the object 11 is located at a short distance, data may be obtained even with one pulse emission. On the other hand, data for the distant object 11 cannot be obtained unless a large number of pulse emission data are accumulated.

Thus, the capability of obtaining a measurement result in the middle of the measurement makes it possible to output, more quickly, information related to the object 11 located close to the optical radar apparatus. For example, if an object located immediately close to a vehicle or a robot equipped with the optical radar apparatus 100 can be detected in even $\frac{1}{30}$ (seconds) or more quickly, then it becomes possible to issue an alarm to a control system of the vehicle or the robot to prevent a collision. In a practical situation, it is very unlikely that the relative speed reaches as high as 100 km/h for the object 11 in a short distance of several meters. When the speed is 30 km/h, the distance any object can move in $\frac{1}{30}$ (seconds) is about 30 cm. Therefore, although $\frac{1}{30}$ is a short period of time, it is possible to increase the probability of avoiding a collision by performing control in $\frac{1}{30}$ (seconds).

Of the two-dimensional image information $G1(i,j)$, $G2(i,j)$, the two-dimensional image information $G1(i,j)$ is information originating from background light, and this information is useful for recognizing the shape or the like of the object 11. In particular, in a case where information from a normal image sensor is used together, it is possible to recognize the object 11 and acquire the distance between the object 11 and the light receiving unit 154 by comparing the information from the normal image sensor and the two-dimensional image information $G1(i,j)$ and detecting the object 11 which is common in both information. Furthermore, when there is a large error which makes it difficult to determine the distance, it is possible to detect the object 11 approaching by detecting a time-dependent change in the two-dimensional image information $G2(i,j)$. More specifically, if a significant increase is detected in the value of the two-dimensional image information $G2(i,j)$, this means that the object 11 is approaching the pixel Px(i,j). If a significant reduction is detected in the value of the two-dimensional image information $G2(i,j)$, this means that the object 11 is moving away from the pixel Px(i,j). The two-dimensional image information $G2(i,j)$ may be compared between consecutive frames or between distant frames, or may be compared for each of a plurality or a single pulse emission.

Figure 8:
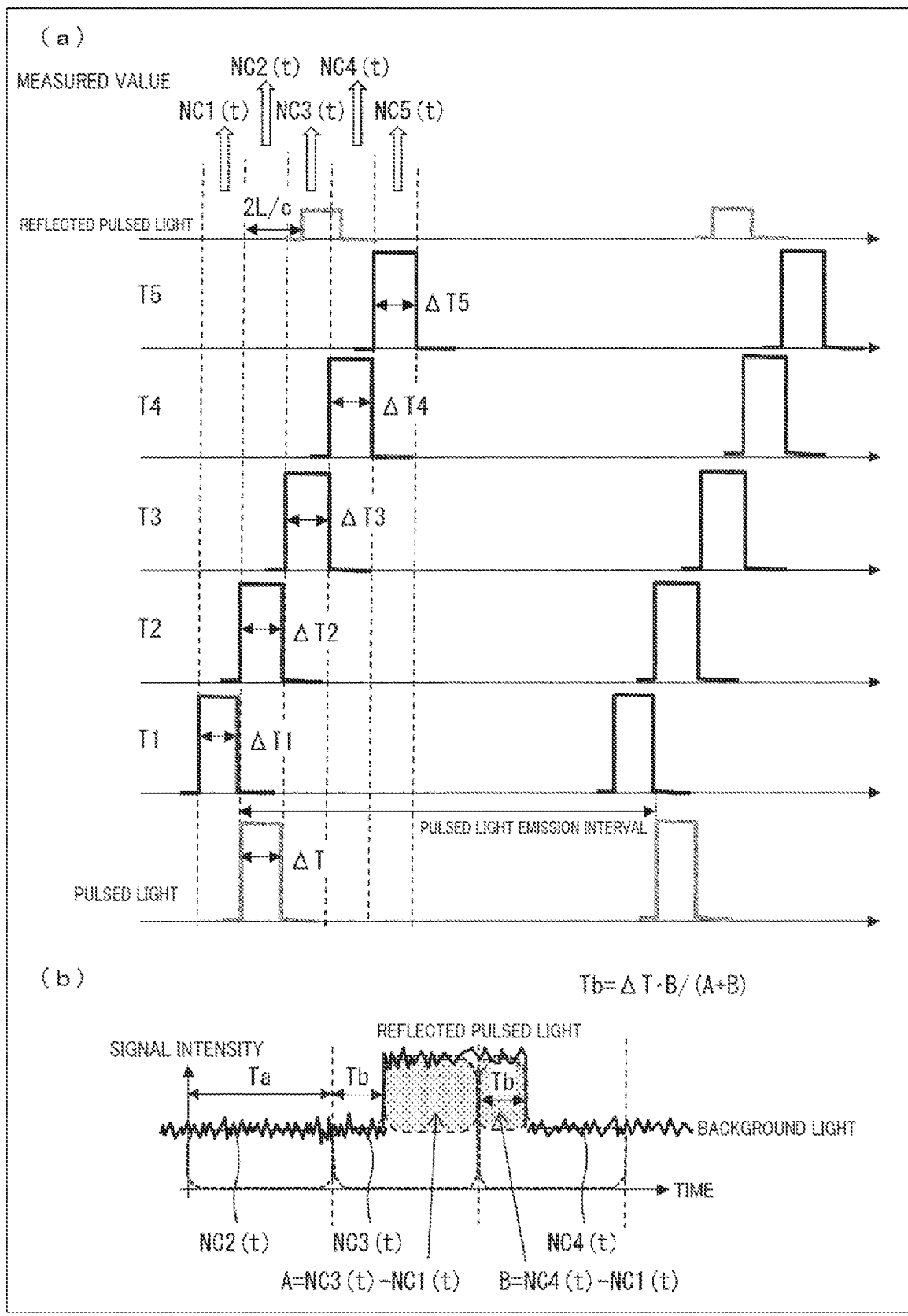
FIG. 8(a) is a timing chart illustrating a timing of driving the pixel storage element.
FIG. 8(b) is a waveform diagram illustrating reflected pulsed light in an enlarged manner.

The signal processing circuit DS may control the order of reading the number of counts of photons from pixels Px(i,j) in the M×N array, and may control the procedure of calculating the distance information D(i,j) and the two-dimensional image information $G1(i,j)$, $G2(i,j)$ based on the numbers of counts. The signal processing circuit DS may include a memory used for the control described above. The signal processing circuit DS may control the timing of counting the photon detection signals from the pixel Px(i,j). This control is performed, for example, such that, to achieve high accuracy in measuring of a signal of background light, the activation time of the signal T1 shown in FIG. 8 is several times longer than the activation time of the other signals Tα.

The signal processing circuit DS may control the timing of generating the pulsed light, or may control the timing of activating the pixels Px(i,j). For example, to measure the background light described above, the signal processing circuit DS activates a pixel Px(i,j), stores the number of counts in BC1 during the time period ΔT1, and issues, at a time when the time period ΔT1 has elapsed, a signal to the pulsed light illumination system via the control element such that pulsed light is emitted. Thus, a signal T2 is activated when the time period ΔT1 has elapsed.

The signal storage processing unit 155 or the control element 160 may include a memory for storing at least distance information D(i,j) associated with all pixels and two-dimensional image information $G1(i,j)$, $G2(i,j)$. The signal processing circuit DS may sequentially store the obtained these pieces of information in this memory and may output them to the external system 300 via the control element 160 in response to a request from the external system 300. In a case where the signal processing circuit DS has a memory capable of storing a plurality of frames, the signal processing circuit DS may further output a result of comparison and/or calculation between frames.

<Verification of Effects>

A prototype apparatus was produced based on the above embodiment, and its characteristics were evaluated. As for the pulsed light illumination system 110, three VCSELs having a peak wavelength of 945 nm were used as the light emitting elements 122. They were driven such that pulsed light was emitted with a peak output of 25 W and with a pulse full width at half maximum of 100 nsec. Regarding the diffusing optical system 123, a diffusion plate was provided in an optical path of each laser element thereby achieving almost uniform irradiation in a range of horizontal irradiation angle θh=900 and vertical irradiation angle θv=20°. At a distance of 30 m from the pulsed light illumination system 110, the irradiation intensity was the highest at the center of the irradiation area and the value thereof was 12 μW/cm², while the irradiation intensity was lowest in the four corners and the minimum value thereof was 10.6 μW/cm². The maximum and minimum values were within a range of ±10% around the average value. The repetition frequency of laser pulses was set to 19 kHz to meet the class 1 conditions. Assuming that images were acquired at a rate of 30 frames per second, In one frame, data was accumulated for up to 633 laser pulses in one frame.

As for the imaging optical system 151 of the light receiving system 140, a lens having a focal length of 4.5 mm, an F number of 1.8, and an effective diameter of 2.5 mm was used. As for the optical bandpass filter 152, an interference filter was used. The center wavelength thereof selected such that the peak wavelength of the laser was coincident with the center value of the transmission band at room temperature. As shown in FIG. 2, the interference filter was coated on the inner side of the lid glass 171 hermetically sealing the package 170 containing the three-dimensional image sensor 153. Nitrogen with a low dew point was used as the atmosphere 172 in the package.

The full width at half maximum of the transmission band of the interference filter was 10 nm, and the average transmittance was 55%. The temperature dependence of the emission peak wavelength of VCSEL was 0.07 nm/K, and that of the center value of the transmission band of the interference filter was 0.025 nm/K, and thus the relative deviation between the laser peak wavelength and the center value of the interference filter transmission band was +2.8 nm in a temperature range between 85° C. and −40° C. This shift is within the transmission band width of 10 nm even if the full width at half maximum of 1 nm of the laser emission peak was taken into account, and VCSEL was capable of being used without temperature control. It is important to match the emission peak wavelength of the light emitting element 122 with the transmission band center value of the optical bandpass filter 152 in a temperature range around the operating temperature.

In the light receiving unit 154 of the three-dimensional image sensor 153, 50 μm square pixels Px(i,j) were arranged such that the number of effective pixels in the horizontal direction was 180 and the number of effective pixels in the vertical direction was 40 and thus it had a total of 7.2 k effective pixels. The area of the effective part of the light receiving unit 154 is 9 mm×2 mm=18 mm².

In the pixel Px(i,j), as shown in FIG. 4, seven circular SPADs 180 having an effective detection area of 10 μm in diameter were disposed. In each SPAD 180, a microlens 181 having a base size of 15 μm was provided. The height of the microlens was about 10 μm. The fill factor of this pixel Px(i,j) was 22%. Each SPAD 180 was operated with a deadtime Td of 20 nsec. The effective quantum efficiency of the SPAD 180 having this microlens 181 was 10%.

A white plate with a reflectance of 50% for 945 nm infrared light was placed and the measurement was performed at noon on a clear day. The average number of received photons originating from background light was 0.29 per one SPAD 180 and per 100 nsec. Therefore, the average total number of photons detected for the background light by the seven SPADs was 1.9 per 100 nsec. When counting was performed using 1.0 nsec wide pixel signal pulses, there is a 2% chance of undercounting due to simultaneous multiple photon detection, however, this number is not so great that the result of counting is affected.

Between the light receiving unit 154 and the signal storage processing unit 155 of the three-dimensional image sensor 153, signal lines Lx(i,j) connecting the respective pixels Px(i,j) and the corresponding pixel storage elements Mx(i,j) are provided. As shown in FIG. 3, when the signal storage processing unit 155 is disposed on one side of the light receiving unit 154, it is necessary to dispose at least 40 wires within a width of 50 μm. If the wiring is arranged at a pitch of 1 μm, the wiring can be realized in the form of a single-layer wiring. However, because power supply lines and other wirings are also required, the signal lines Lx(i,j) are formed in two upper layers in a multilayer structure. The length is about 2.5 mm, and the wiring delay time is dominated by the capability of the signal line drive circuit 197 in terms of the driving capability of charging parasitic capacitance of the signal line Lx(i,j). The area that can be used for the signal line drive circuit 197 is limited, and thus a delay time of about several hundred psec occurs. Therefore, the delay time of the delay circuit 194 of the photon detection signal generation unit 191 shown in FIG. 6 was set to 500 psec. On the other hand, the delay time of the delay circuit 199 of the pixel signal output circuit 196 was set to 700 psec.

The image storage element Mx(i,j) shown in FIG. 7 includes four binary counters BC1 to BC4. The binary counters BC1 and BC4 each are a 12-bit binary counter, and the binary counter BC2 is a 16-bit binary counter. The binary counter BC3 is a 13-bit binary counter. There is a possibility that the binary counters BC2 and BC3 count a large number of counts when strong laser pulse reflected light is received from an object 11 located at a short distance from the three-dimensional image sensor 153. In view of the above, the binary counters BC2 and BC3 were configured to have an increased number of bits.

Since the total number of output bits (g1 to g4) of the binary counters BC1 to BC4 is 53 (=12+16+13+12), it is difficult to configure the column signal line C(j) with 53 parallel wires. For this reason, the number of signal lines constituting the column signal line C(j) needs to be equal to or greater than the maximum number of output bits of the binary counters BC1 to BC4. Therefore, the column signal line C(j) needs to be configured with 16 signal wirings so as to correspond to the 16 bits of the binary counter BC2, which is the maximum number of output bits, and it is necessary to read out data for each binary counter. Therefore, the row selection circuit 161 sequentially selects row selection signal lines R1(i), R2(i), R3(i), and R4(i) for each row. In response to the row selection signal lines R1(i), R2(i), R3(i), and R4(i) being activated, the output switch 211 connects the output of the corresponding one of the binary counters PC1, BC2, BC3, and BC4 to the column signal line C(j).

In order to reduce the circuit scale, the signal processing circuit DS was configured to include only one processing circuit. The signal processing circuit DS was configured to include a memory for temporarily storing data of the binary counters BC1 to BC4, a 16-bit microcomputer for executing a distance calculation, and the like. Use of the microcomputer makes it possible to change an algorithm used for distance extraction. The microcomputer used had the number of bits greater than the maximum number of bits of the binary counters BC1 to BC4 (16 bits in this case) such that the distance extraction was capable of being performed at an enhanced speed which allowed it to extract distance for all pixels in a time interval (about 50 psec) between pulse emissions. When an existing microcomputer is used, it is possible to complete the design in a short time period, but the area of the signal processing circuit DS is increased which may result in an increase in cost. In view of the above, in order to reduce the area of the signal processing circuit DS and reduce the cost, a dedicated circuit may be designed.

Use of the microcomputer having a programming capability as the signal processing circuit DS makes it possible to program in what order the pixel storage elements Mx(i,j) are processed. For example, in a case where the optical radar apparatus 100 is used for monitoring a surrounding of a vehicle, it is more likely that an obstacle appears near a lower end of the field of view than near an upper end. In this case, it is preferable to perform processing starting from the lower part of the visual field toward the upper part. In a case where the optical radar apparatus 100 is disposed in a rear left corner of the vehicle, when the vehicle moves backward, obstacles may be detected more quickly by performing checking starting from a left edge of the field of view. In a case where a child or an elderly person is found ahead, checking may be performed placing a focus on an area close to the detected person.

The signal processing circuit DS has a memory (230 kb) having a capacity of 32 bits per one pixel Px(i,j). This memory is capable of accumulating two-dimensional image information G2(i,j) for a plurality of frames. This makes it possible to improve the accuracy of distance information. Furthermore, it is possible to store an accumulated value of the distance information and comparing it with another measured value or another accumulated value thereby detecting approaching or moving away.

In a case where the signal processing circuit DS is laid out using a 0.13 μm process, the area of the signal processing circuit DS is 2 mm×2 mm, the area of the pixel storage element Mx(i,j) is 50 μm×20 μm, and the size of the three-dimensional image sensor 153 is 10 mm×5.5 mm. The signal processing circuit DS also includes a non-volatile memory for storing operation conditions such as a distance extraction algorithm, a scanning order of the pixel storage elements Mx(i,j), and the like.

Using the optical radar apparatus 100 and using, as the object 11, a white plate with a reflectance of 50% for infrared light of 945 nm, pulsed light was evaluated in a measurable range under the three conditions of clear sky, cloudy sky, and night. In clear daytime, the average numbers of counts of the respective binary counters BC1, BC2, BC3, and BC4 for one emission of pulsed light were 1.9, 7.5, 2.0, and 1.9, which allowed it to detect presence of the object 11 located at a small distance of 2 m. The result also showed that it was possible to detect the object 11 at a distance up to 3.5 m. Thus, the measurement with one emission of pulsed light allows it to detect where the nearest object 11 is located and allows it to transmit the result to the external system 300.

On the other hand, the difference between the binary counter BC3 and the binary counter BC1 in one measurement was as small and no difference was observed within the margin of error, and the distance between the light receiving unit 154 and the object 11 was not detected. However, by performing such measurement and repeatedly and detecting a temporal change in the number of counts of the binary counter BC2, it is possible to determine the distance as follows. When the number of counts of the binary counter BC2 corresponding to the same pixel Px(i,j) increases, it can be determined that the distance is decreasing. On the other hand when the number of counts decreases, it can be determined that the distance is increasing. Based on such determination, i-t is useful to output the pulsed light reflection intensity for each frame.

The cumulative counting was performed up to 633 emissions of pulsed light ($633=\frac{1}{30}\times19{,}000$). When the distance was 19 m or less, the object 11 was detected, and an estimated distance was obtained down to 9 m. Therefore, in a range from 9 m to 19 m, it is necessary to detect a change in a value of the two-dimensional image information G2(i,j).

In cloudy weather, when the cumulative counting was performed up to 633 emissions of pulsed light, the object 11 was detected when the distance was 30 m or less, and the distance could be estimated down to 23 m. Similarly, at night, the object 11 could be captured in a distance range up to 30 m or more, and the distance could be estimated in a range up to 25.5 m. Even when the surroundings are dark, such as at night, and it is difficult to monitor the surroundings with normal camera images, the three-dimensional image sensor 153 according to the present embodiment can collect the surrounding three-dimensional information including distance information.

Embodiment 2

Embodiment 2 of the present invention is described below with reference to FIG. 10.

Figure 10:
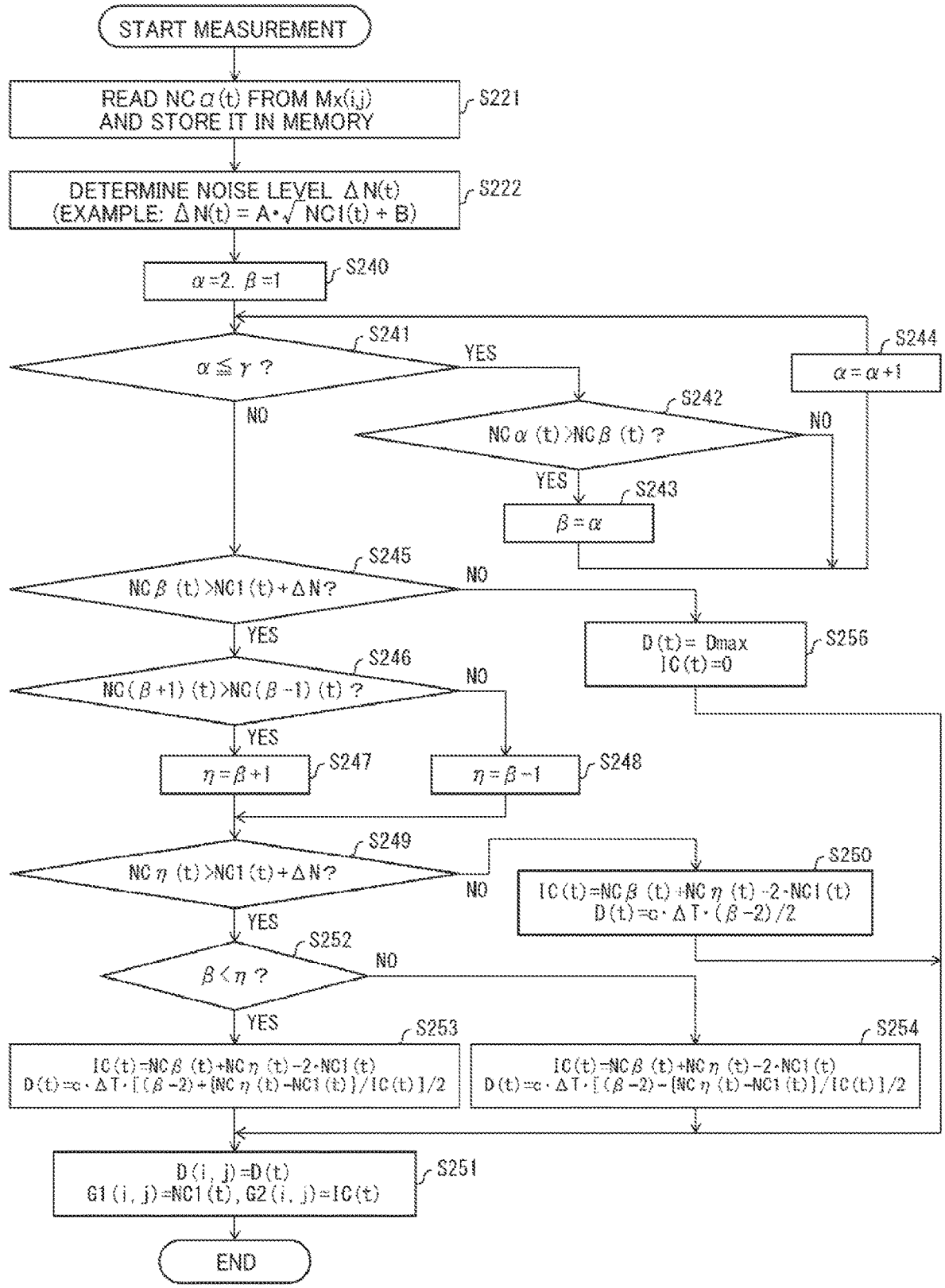
FIG. 10 is a flow chart illustrating a procedure of signal processing by a signal processing circuit in the three-dimensional image sensor of the optical radar apparatus according to Embodiment 2 of the present invention.

FIG. 10 is a flow chart illustrating a signal processing procedure by the signal processing circuit DS in the three-dimensional image sensor 153 of the optical radar apparatus 100 according to the present embodiment.

The optical radar apparatus 100 according to the present embodiment is the same as that of the first embodiment except that the distance extraction algorithm used by the signal processing circuit DS is different from that of the first embodiment. The distance extraction algorithm according to the first embodiment is simple, but a measurement error tends to often occur when the difference between the number of counts $NC\beta(t)$ and the number of counts $NC1(t)$ is small, or when the difference between $NC(\beta+1)(t)$ and $NC1(t)$ is small. The algorithm described below improves the situation described above. FIG. 10 is a schematic diagram illustrating a signal processing procedure by the signal processing circuit DS in the three-dimensional image sensor 153 of the optical radar apparatus 100 according to the present embodiment.

As shown in FIG. 10, the signal processing circuit DS first performs the processing in steps S221 and S222 shown in FIG. 9, and then executes loop processing for searching for a maximum value of $NC\alpha(t)$ (steps S240 to S243). At the beginning of this loop processing, the signal processing circuit DS sets the initial value of α to, for example, 2, and sets the initial value of β to 1 (step S240). Then the signal processing circuit DS determines whether α is equal to or smaller than the total number of binary counters γ (step S241). In a case where the signal processing circuit DS determines in step S241 that α is equal to or smaller than the total number of binary counters γ (YES in step S241), then the signal processing circuit DS further determines whether this α and β satisfy a condition represented by a mathematical expression described below (step S242).

$$NC\alpha(t) > NC\beta(t)$$

In a case where the signal processing circuit DS determines in step S242 that the above condition represented by the formula described above is satisfied for α and β described above (YES in step S242), the signal processing circuit DS employs this α as β (step S243). On the other hand, in a case where the signal processing circuit DS determines in step S242 that the above condition represented by the formula described above is not satisfied for α and β described above (NO in step S242), the signal processing circuit DS does not change the value of β. In either case (YES or NO in step S242), the signal processing circuit DS1 adds 1 to the value of α (step S244), and returns the process to step S241.

In a case where the signal processing circuit DS determines in step S241 that α is greater than the total number of binary counters γ (NO in step S241), the maximum value of $NC\alpha(t)$ is determined and the value of β is also determined.

Next, the signal processing circuit DS determines whether β described above satisfies a condition represented by a formula described below, that is, whether the difference between the number of counts $NC\beta(t)$ and the number of counts $NC1(t)$ is greater than a noise level N (step S245).

$$NC\beta(t) > NC1(t) + \Delta N$$

In a case where the signal processing circuit DS determines in step S245 that the above condition is satisfied for β described above (YES in step S245), it can be concluded that the number of counts $NC\beta(t)$ is significantly larger than the number of counts $NC1(t)$. In this case, the signal processing circuit DS further determines whether β satisfies a condition represented by a formula described below (step S246).

$$NC(\beta+1)(t) > NC(\beta-1)(t)$$

In a case where the signal processing circuit DS determines in step S246 that the above condition represented by the formula described above is satisfied for β described above (YES in step S246), the signal processing circuit DS sets η to be value given by β+1 (step S247). In a case where the signal processing circuit DS determines in step 1246 that the above condition represented by the formula described above is not satisfied for β described above (NO in step 1246), the signal processing circuit DS sets η to be value given by β−1 (step S248).

After step S247 or S248, the signal processing circuit DS determines whether η described above satisfies a condition represented by a formula described below, that is, whether the difference between the number of counts $NC\eta(t)$ and the number of counts $NC1(t)$ is greater than a noise level N (step S249).

$$NC\eta(t) > NC1(t) + \Delta N$$

In a case where the signal processing circuit DS determines in step S249 that the above condition is not satisfied for β described above (NO in step S245), it can not be concluded that the number of counts $NC\eta(t)$ is significantly larger than the number of counts $NC1(t)$. In this case, if η and β are determined, then the signal processing circuit DS calculates a measurement result according to a following formula (step S50).

$$IC(t)=NC\beta(t)+NC\eta(t)-2\cdot NC1(t)$$

$$D(t)=c\cdot\Delta T\cdot(\beta-2)/2$$

As a result of the calculation described above, the signal processing circuit DS obtains distance information D(i,j) and two-dimensional image information G1(i,j), G2(i,j) described below (step S251) The signal processing circuit DS stores the calculated distance information D(i,j) and the two-dimensional image information G1(i,j), G2(i,j) in a memory and outputs them to the external system 300 as required.

In a case where the signal processing circuit DS determines in step S249 that the above condition is satisfied (YES in step S249), it can be concluded that the number of counts NCη(t) is significantly larger than the number of counts NC1(t) In this case, the signal processing circuit DS determines whether β is smaller than η (step 3252).

In a case where the signal processing circuit DS determines in step S252 that β is smaller than η, the signal processing circuit DS calculates a measurement result according to the following formula (step S253), and the process proceeds to step S251.

$$IC(t)=NC\beta(t)+NC\eta(t)-2\cdot NC1(t)$$

$$D(t)=c\cdot\Delta T\cdot[(\beta-2)+\{NC\eta(t)-NC1(t)\}/IC(t)]/2$$

In a case where the signal processing circuit DS determines in step S252 that β is not smaller than η (β is equal to or larger than η), the signal processing circuit DS calculates a measurement result according to the following formula (step S254), and the process proceeds to step S251.

$$IC(t\ NC\beta(t)+NC\eta(t)-2\cdot NC1(t)$$

$$D(t)=c\cdot\Delta T\cdot[(\beta-2)-\{NC\eta(t)-NC1(t)\}/IC(t)]/2$$

In a case where the signal processing circuit DS determines in step 3245 that the above condition is not satisfied for the β described above (NO in step S245), the signal processing circuit DS determines that there is no object 11 in the measurable range. In this case, the signal processing circuit DS concludes that the result is given by D(t)=Dmax and IC(t)=0 (step S256), and the process proceeds to step S251.

In this way, the signal processing circuit DS calculates and stores the distance information D(i,j) and the two-dimensional image information G1(i,j), G2(i,j), and outputs them to the external system 300. In the algorithm described above, the distance and other values are calculated according to the formula in step S253 or S254 depending on the magnitude relationship between β and η (step 3252). Thus, the distance can be obtained with the highest accuracy.

Embodiment 3

Embodiment 3 of the present invention is described below with reference to FIG. 11.

Figure 11:
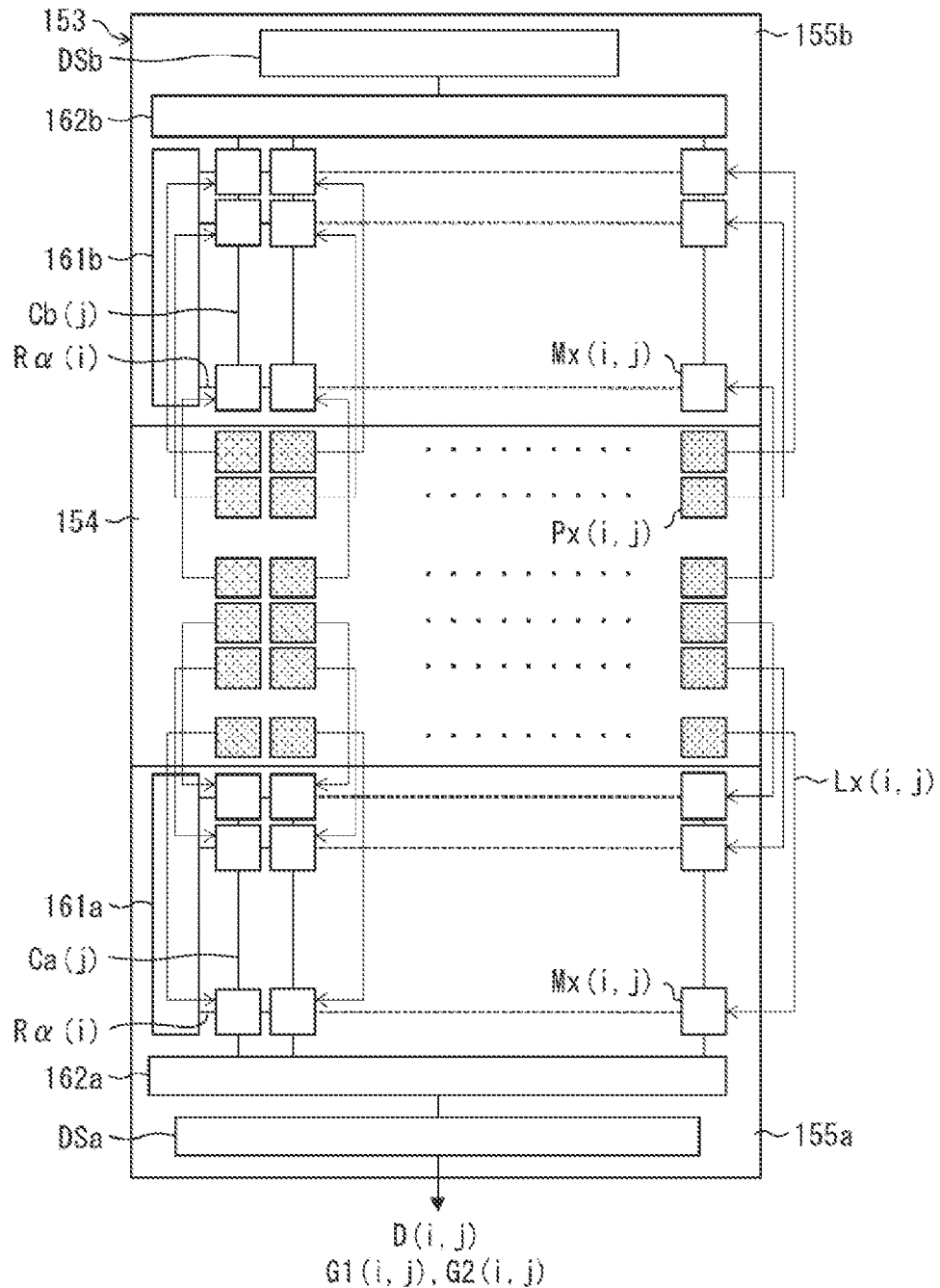
FIG. 11 is a block diagram illustrating a configuration of a three-dimensional image sensor constituting an optical radar apparatus according to Embodiment 3 of the present invention.

FIG. 11 is a block diagram showing a configuration of the three-dimensional image sensor 153 constituting the optical radar apparatus 100 according to the present embodiment.

The essential difference of the present embodiment from Embodiment 1. Is that the maximum number of binary counters BCα constituting the pixel storage element Mx(i,j) is increased to 21. In order to improve the distance measurement accuracy, the full width at half maximum ΔT of the pulsed light was reduced to ΔT=10 nsec so as to be 1/10 of that in Embodiment 1. The distance estimation algorithm used is Embodiment 1 is also employed in the present embodiment. The details will be described below.

By setting ΔT=ΔTα=10 nsec (α>1), it is possible to improve the time resolution. However, the number of binary counters BCα is increased to 21, which causes an increase in the area of the pixel storage elements Mx(i,j) To handle the above situation, as shown in FIG. 11, the three-dimensional image sensor 153 includes divided signal storage processing units 155a and 155b. The signal storage processing units 155a and 155b are respectively disposed on two opposite sides of the light receiving unit 154, and more specifically, the signal storage processing unit 155a is disposed on a side which is lower side in the figure, while the signal storage processing unit 155b is disposed on a side which is an upper side in the figure.

The light receiving unit 154 is not essentially changed from the light receiving unit 154 according to Embodiment 1. The signal storage processing unit 155a performs signal processing on 20 rows of pixels Px(i,j) in a half area, in the light receiving unit 154, located on the side close to the signal storage processing unit 155a. The signal storage processing unit 155b performs signal processing on 20 rows of pixels Px(i,j) in a half area, in the light receiving unit 154, located on the side close to the signal storage processing unit 155b.

The numbers of bits of the binary counters BCα are changed to 16 bits to 12 bits depending on the particular binary counters taking into consideration the maximum signal values that can be counted by the respective binary counters BCα. The numbers of bits of the binary counters BC1, BC2, BC3, BC4, and BC5 are respectively set to 16 bits, 17 bits, 15 bits, 14 bits, and 13 bits. The number of bits of the binary counters BC6 to BC22 are set to 12 bits.

The result of greatly increasing the numbers of binary counters BC1 to BC21 is an increase in the number of transistors constituting the time switch 210 and connected to the signal lines Lx(i,j). As a result, loads on the signal lines Lx(i,j) increase, which may result in an increase in the signal delay. To handle this situation, a buffer is added at the forefront of the time switch 210. The increase in the area of the pixel storage elements Mx(i,j) causes an increase in the length for some signal lines Lx(i,j) However, the provision of the buffer provides measures against the increase in the wiring delay due to the increase in the length of signal lines Lx(i,j).

The signal storage processing units 155a and 155b respectively include row selection circuits 161a and 161b, column selection circuits 162a and 162b, column signal lines Ca(j) and Cb(j), and signal processing circuits DSa and DSb. The signal processing circuits DSa and DSb each have the same ability so as to handle an increased amount of data. Therefore, the signal storage processing units 155a and 155b can perform data processing of the respective corresponding areas in parallel.

The signal processing circuits DSa and DSb each include one processing circuit system. However, only the signal processing circuit DSa has a function of controlling timing of emitting laser light, a function of controlling timing of activating pixel s Px(i,j), a function of reading signals from pixels Px(i,j) arranged in M rows and N columns (in an array), a function of controlling calculation procedure, a function of managing a memory, and the like.

In the present embodiment, the full width at half maximum of the laser pulse is shortened to 10 nsec, and correspondingly the repetition frequency is increased to 190 kHz. Therefore, when the frame interval is 1/30 sec, data of up to 6333 (=1/30×190,000) pulses can be stored. The average pulsed light emission interval is about 5 μsec, and thus it is difficult to process data each time a lighted pulse is emitted. However, data can be read from the pixel storage elements Mx(i,j) in parallel with the accumulation of data in the pixel storage elements Mx(i,j), and thus reading can be performed at any timing.

The three-dimensional image sensor 153 according to the present embodiment has a size of 10 mm×9 mm=90 mm$^2$, which is larger than the size of the three-dimensional image sensor 153 according to Embodiment 1. However, as will be described below, the distance measurement accuracy of the three-dimensional image sensor 153 according to the present embodiment is improved compared to the three-dimensional image sensor 153 according to Embodiment 1. The three-dimensional image sensor 153 detected the object 11 at a distance up to 19 m under the maximum accumulation condition of a 1/30 sec frame period in the daytime in fine weather. The maximum measurement error at a distance in a range from 6 m (exclusive) to 19 m (inclusive) was 1 m. The maximum measurement error at a distance in a range from 1 m (inclusive) to 6 m (inclusive) was 0.31 m. The distance measurement for a distance greater than 9 m was difficult in Embodiment 1 without referring to the time-dependent change of 1C(t) However, in the present embodiment, it is possible to perform measurement for a distance of up to 19 m although there is an error.

Furthermore, an improvement in the measurement accuracy of the three-dimensional image sensor 153 according to the present embodiment is achieved also in cloudy weather and at night. In cloudy weather, the three-dimensional image sensor 153 detected the object 11 at a distance of up to 30 m, and the maximum distance measurement error in a range up to 30 m was 0.5 m. At night, the three-dimensional image sensor 153 detected the object 11 at a distance of up to 30 m, and the maximum measurement error is 0.3 m.

Improvements are also achieved in short-time measurements. In the daytime in fine weather, when accumulation was performed for 10 pulses of light, it was possible to detect the object 11 at a range up to 3 m, and the distance could be measured with a maximum error of 0.5 m. In a caser where the accumulation of signals in the pixel storage elements Mx(i,j) was performed for 100 pulses, It was possible to measure the distance in range of up to 3 m with a maximum error of 0.27 m. Even in a situation in which the measurement of distance according to Embodiment 1 was difficult, the present embodiment showed an improvement and it was possible to measure the distance in a short time.

Embodiment 4

Embodiment 4 of the present invention is described below.

The present embodiment is basically similar to Embodiment 3 except for the following point. In the present embodiment, the numbers of bits of the binary counters BCα constituting the pixel storage elements Mx(i,j) are set to be 12 bits for all binary counters BCα thereby achieving simplification in design.

When the distance from a pixel Px(i,j) of the light receiving unit 154 to the object 11 is short, there is a possibility that overflow may occur in binary counters BC2, BC3, or the like during measurement. However, in such a pixel Px(i,j), the distance can be measured with sufficiently high accuracy before overflow occurs in a binary counter. Therefore, it is possible to determine the measurement result before overflow occurs, and it is possible to store the result in the memory without practical problems.

As in Embodiment 1, the signal processing circuit. DS according to the present embodiment may include a memory (230 kb) having a capacity of 32 bits per one pixel Px(i,j), or the signal processing circuit DS may include an additional memory (86 kb) having a capacity of 12 bits per one pixel Px(i,j). Note that 12 bits is a sufficient number of bits to describe a distance of up to 30 m in units of cm using a 2-bit integer.

In the flow chart for determining the distance shown in FIG. 10, when NCβ(t) determined in the loop of steps S240 to S243 exceeds a certain value (for example, $2^{11}$=2048), the reading from a corresponding pixel storage element Mx(i,j) may be stopped. At the same time, the distance information D(i,j) obtained in step S251 is stored in: the 86 kb memory described above. Regarding the two-dimensional image information G1(i,j), G2(i,j), to obtain information correspond to the pixels where accumulation is performed for 190 kHz laser pulse emission, when measurement is performed for as many pulses as N1, all pieces of information are needed to be multiplied by (6333/N1) and stored in the 230 kb memory.

[Example of Implementation by Software]

The signal processing circuit DS shown in FIG. 3 and the signal processing circuits DSa and DSb shown in FIG. 11 each may be realized using a logic circuit (hardware) formed in an integrated circuit (IC chip) or the like so as to achieve their functions, or the functions thereof may be achieved by software in cooperation with a microcomputer as described above.

In the latter case, the signal processing circuits DS, DSa, and DSb each include a CPU (Central Processing Unit) that executes an instruction of a program, which is software that realizes each function, a ROM (Read Only Memory) or a storage device (these are referred to as "storage medium") in which the above-described program and various data are stored so as to be readable by a computer (or a CPU), a RAM (Random Access Memory) in which the above-described program is loaded, and the like. The computer (or CPU) reads the program from the storage medium and executes the program thereby achieving the object of the present invention.

As for the storage medium, a "non-transitory physical medium" such as a tape, a disk, a card, a semiconductor memory, a programmable logic circuit, or the like may be used. The program may be supplied to the computer via any transmission medium (such as a communication network or a broadcast wave) that can transmit the program. Note that an aspect of the present invention may also be implemented in the form of a data signal embedded in a carrier wave, in which the program is embodied by electronic transmission.

[Summary]

In Aspect 1 of the present invention, a three-dimensional image sensor includes a light receiving unit 154 including a plurality of pixels Px(i,j) each including an avalanche photodiode (SPAD 180) configured to detect, in Geiger mode, a photon of incident light including reflected light from an object 11 to be detected, a plurality of accumulating units (pixel storage elements Mx(i,j)) provided for the respective pixels in a one-to-one manner, each accumulating unit being configured to accumulate pulse signals output from a corresponding one of the pixels Px(i,j) as a result of detecting photons for each of temporally successive time intervals (having time lengths ΔT1 to ΔTγ), and a calculation unit (a signal processing circuit DS) configured to calculate distance information regarding a distance between the light receiving unit 154 and the object 11 for each pixel Px(i,j) by using a time series of groups of accumulated values (NCα) accumulated by the accumulating units.

In Aspect 1 described above, accumulating pulse signals over a plurality of measurements makes it possible to obtain distance information with an improved SN ratio. For example, when the intensity of the background light is 100 in one measurement, the shot noise of the background light is on the order of $\sqrt{100}$=10. When the intensity of reflected light from the object 11 is 10, if pulse signals detected over 100 measurements are accumulated, then the intensity of the background light is 10000, and the shot noise is on the order of 100. On the other hand, the intensity of the reflected light is 1000, which is an order of magnitude larger than the noise of the background light, and which can be reliably detected.

This eliminates the need to use infrared light with a wavelength of about 1.5 μm to minimize the influence of daytime background light as in the conventional techniques, and thus it is allowed to use a silicon-type light receiving element (a silicon-type avalanche photodiode). Therefore, it is possible to provide, at low cost, the optical radar apparatus that provides an extended distance measurement range even in an environment in which there is strong background light.

In the three-dimensional image sensor according to Aspect 2 of the present invention, based on Aspect 1, the calculation unit may have a function of determining a noise level of the groups of accumulated values based on the groups of accumulated values, a function of determining an accumulated value greater than the noise level in the groups of accumulated values, further determining a temporally adjacent accumulated value, and extracting a pair of the resultant accumulated values, and a function of determining a time of flight of light from the extracted pair with an accuracy shorter than the time interval.

In the three-dimensional image sensor according to Aspect 3 of the present invention, based on Aspect 1 or 2, the calculation unit may perform reading of the accumulated values from the accumulating unit in parallel with accumulating pulse signals performed by the accumulating unit.

In Aspect 2 described above, even during the accumulating operation, the accumulated value can be read out. This makes it possible to more quickly output the distance information regarding a distance to an object located close to the three-dimensional image sensor.

In the three-dimensional image sensor according to Aspect 4 of the present invention, based on one of Aspects 1 to 3, the light receiving unit 154, the accumulating unit, and the calculation unit may be monolithically formed on a silicon substrate.

In Aspect 4 described above, the production process is simplified, and thus it is possible to provide the three-dimensional image sensor at lower cost.

In the three-dimensional image sensor according to Aspect 5 of the present invention, based on one of Aspects 1 to 4, each of the pixels Px(i,j) may include a plurality of avalanche photodiodes.

In Aspect 4 described above, a further improvement in detection accuracy is achieved.

In the three-dimensional image sensor according to Aspect 6 of the present invention, based on one of Aspects 1 to 5, the accumulating units each may include a plurality of binary counters BCα for accumulating the pulse signals for each time interval.

In the three-dimensional image sensor according to Aspect 7 of the present invention, based on Aspect 6, a switching circuit (a column selection circuit 162) configured to switch the groups of accumulated values from the respective binary counters BCα for each binary counter BCα and output the accumulated values to the calculation unit, the number of signal lines via which the groups of accumulated values are output from the switching circuit to the calculation unit may be equal to or greater than the maximum number of output bits of each binary counter BCα.

In Aspect 6 described above, since the accumulated values from the respective binary counters are switched for each binary counter and output to the calculation unit, the number of signal lines via which the accumulated values are output may be at least equal to the maximum number of output bits of each binary counter. This makes it possible to simplify the wiring structure between the binary counters and the calculation unit.

In the three-dimensional image sensor according to Aspect 8 of the present invention, based on one of Aspects 1 to 7, the calculation unit may read the groups of accumulated values from the accumulating units in a prestored order.

In Aspect 8 described above, it is possible to quickly read, from an accumulating unit, an accumulated value in terms of the number of photons obtained from a pixel detecting reflected light from an object located close to the three-dimensional image sensor.

In the three-dimensional image sensor according to Aspect 9 of the present invention, based on one of Aspects 1 to 8, the calculation unit may further calculate light intensity information representing an intensity of the incident light using the groups of accumulated values.

In Aspect 9 described above, it is possible to determine a two-dimensional image of an object by light intensity information. It is possible to further obtain a three-dimensional image by combining the light intensity information and distance information.

In Aspect 10 of the present invention, an optical radar apparatus includes a light emitting element 122 configured to emit pulsed light to illuminate an object to be detected, and the three-dimensional image sensor 153 according to one of Aspects 1 to 9, wherein the avalanche photodiode in the three-dimensional image sensor 153 detects a photon of reflected light of the pulsed light reflected from the object 11.

In Aspect 10 described above, it is possible to provide, at low cost, the optical radar apparatus that provides a wide measurement range.

In the optical radar apparatus according to Aspect 11 of the present invention, based on Aspect 10, the light emitting element may emit pulsed light a plurality of times, and the accumulating unit of the three-dimensional image sensor may accumulate a time series of groups of accumulated values acquired by the three-dimensional image sensor each time a plurality of pulses of light are emitted.

In the optical radar apparatus according to Aspect 12 of the present invention, based on Aspect 10 or 11, the three-dimensional image sensor 153 may output distance information regarding the distance to the object, first light intensity information (two-dimensional image information G2(*i, j*)) representing an intensity of reflected light of the pulsed light radiated to the object 11, and second light intensity information (two-dimensional image information G1(*i,j*)) that does not include reflected light of the pulsed light from the object 11.

In Aspect 12 described above, the second light intensity information is information originating from background light, and this information is useful for recognizing the shape or the like of the object.

Furthermore, when there is a large error which makes it difficult to determine the distance, it is possible to detect the object approaching by detecting a time-dependent change in the first light intensity information. For example, if a significant increase is detected in the value of the first light intensity information, this means that an object is approaching the pixel. If the value of the first light intensity information is decreasing, this means that an object is moving away from the pixel.

In the optical radar apparatus according to Aspect 13 of the present invention, based on one of Aspects 10 to 13, a length of the time interval may be equal to or less than a full width at half maximum the pulsed light.

In Aspect 14 of the present invention, an optical radar apparatus includes a light emitting element 122 configured to emit pulsed light to illuminate an object to be detected, and the three-dimensional image sensor 153 according to Aspect 6 or 7, wherein the avalanche photodiode in the three-dimensional image sensor 153 may detect a photon of reflected light of the pulsed light reflected from the object 11, and part of the binary counters BC of each of the accumulating units accumulates a number of photons of the incident light before pulsed light is emitted to irradiate the object 11.

In Aspect 14 described above, before pulsed light is emitted, the incident light includes only background light, and thus part of binary counters accumulate the number of photons of background light. This makes it possible to acquire the intensity of background light. Therefore, the calculation unit can obtain distance information, in which the influence of the background light is suppressed, by using the intensity of the background light.

[Notes]

The above-described embodiments are to be considered as illustrative in all points and not restrictive. The present invention is not limited to the above-described embodiments, and various modifications are possible within the scope shown in the claims. Any embodiment obtained by appropriately combining technical means disclosed in different embodiments also fall within the technical scope of the present invention. Furthermore, a new technical feature can be obtained by combining technical means disclosed in embodiments.

REFERENCE SIGNS LIST 11 object
100 optical radar apparatus
122 light emitting element
124 pulsed light
153 three-dimensional image sensor
154 light receiving unit
162 column selection circuit (switching circuit)
180 SPAD (avalanche photodiode)
Px(i,j) pixel
Mx(i,j) Pixel storage element (accumulating unit)
Lx(i,j) signal line
C(j), Ca(j), Cb(j) column signal line (signal line)
CS(j) column selection signal line
DS, DSa, DSb signal processing circuit (calculation unit)
BC1, BC2 to BCγ binary counter
G1(i,j) two-dimensional image information (second light intensity information)
G2(i,j) two-dimensional image information (first light intensity information)
g1, g2, to gγ number of output bits

The invention claimed is:

1. An optical radar apparatus comprising:
a light emitting element configured to emit pulsed light to illuminate an object to be detected, and
a three-dimensional image sensor,
wherein the three-dimensional image sensor comprises:
a light receiving unit including a plurality of pixels each including an avalanche photodiode configured to detect, in Geiger mode, a photon of incident light including reflected light from an object to be detected;
a plurality of accumulating units provided for the respective pixels in a one-to-one manner, each accumulating unit being configured to accumulate pulse signals output from a corresponding one of the pixels as a result of detecting photons for each of temporally successive time intervals; and
a calculation unit configured to calculate distance information regarding a distance between the light receiving unit and the object for each pixel by using a time series of groups of accumulated values accumulated by the accumulating units, wherein
the accumulating units are disposed outside the light receiving unit,
wherein the avalanche photodiode in the three-dimensional image sensor detects a photon of reflected light of the pulsed light reflected from the object.

2. The optical radar apparatus according to claim 1, wherein
the light emitting element emits pulsed light a plurality of times, and
the accumulating unit of the three-dimensional image sensor accumulates a time series of groups of accumulated values acquired by the three-dimensional image sensor each time a plurality of pulses of light are emitted.

3. The optical radar apparatus according to claim 1, wherein the three-dimensional image sensor outputs distance information regarding the distance to the object, first light intensity information representing an intensity of reflected light of the pulsed light radiated to the object and reflected from the object, and second light intensity information that does not include reflected light of the pulsed light from the object.

4. A processing apparatus configured to recognize the object using the second light intensity information output from the optical radar apparatus according to claim 3.

5. A processing apparatus configured to detect the object approaching or moving away by detecting a time-dependent change in the first light intensity information output from the optical radar apparatus according to claim 3.

6. A processing apparatus configured to:
using the distance information, the first light intensity information, and the second light intensity information, all output from the optical radar apparatus according to claim 3;
in case where information from another image sensor is used together, recognize the object which is common in both the information from the other image sensor and the second light intensity information by comparing the information from the other image sensor and the second light intensity information; and
when there is a large error which makes it difficult to determine the distance, detect a time-dependent change in the first light intensity information output.

7. The optical radar apparatus according to claim 1, wherein a length of the time interval is equal to or less than a full width at half maximum of the pulsed light.

8. An optical radar apparatus comprising:
a light emitting element configured to emit pulsed light to illuminate an object to be detected; and
a three-dimensional image sensor,
wherein the three-dimensional image sensor comprises:
a light receiving unit including a plurality of pixels each including an avalanche photodiode configured to detect, in Geiger mode, a photon of incident light including reflected light from an object to be detected;
a plurality of accumulating units provided for the respective pixels in a one-to-one manner, each accumulating unit being configured to accumulate pulse signals output from a corresponding one of the pixels as a result of detecting photons for each of temporally successive time intervals; and
a calculation unit configured to calculate distance information regarding a distance between the light receiving unit and the object for each pixel by using a time series of groups of accumulated values accumulated by the accumulating units, wherein
the accumulating units are disposed outside the light receiving unit,
wherein the avalanche photodiode in the three-dimensional image sensor detects a photon of reflected light of the pulsed light reflected from the object, and the accumulating units each includes a plurality of binary counters for accumulating the pulse signals for each time interval.

9. An optical radar apparatus comprising:
a light emitting element configured to emit pulsed light to illuminate an object to be detected, and
a three-dimensional image sensor,
wherein the three-dimensional image sensor comprises:
a light receiving unit including a plurality of pixels each including an avalanche photodiode configured to detect, in Geiger mode, a photon of incident light including reflected light from an object to be detected;
a plurality of accumulating units provided for the respective pixels in a one-to-one manner, each accumulating unit being configured to accumulate pulse signals output from a corresponding one of the pixels as a result of detecting photons for each of temporally successive time intervals; and
a calculation unit configured to calculate distance information regarding a distance between the light receiving unit and the object for each pixel by using a time series of groups of accumulated values accumulated by the accumulating units, wherein
the accumulating units are disposed outside the light receiving unit,
wherein the optical radar apparatus can output the distance information in middle of a frame in addition to the distance information at the end of the frame.

10. The optical radar apparatus according to claim 9, wherein the distance information in middle of a frame is about the object close to the optical radar apparatus.

11. The optical radar apparatus according to claim 9, wherein the distance information in middle of a frame is generated before overflow occur in the pixel storage elements of the three-dimensional image sensor.

* * * * *